US008696833B2

(12) United States Patent
Takasugi et al.

(10) Patent No.: US 8,696,833 B2
(45) Date of Patent: Apr. 15, 2014

(54) NI₃AL-BASED INTERMETALLIC COMPOUND WITH DUAL MULTI-PHASE MICROSTRUCTURE, PRODUCTION METHOD THEREOF, AND HEAT RESISTANT STRUCTURAL MATERIAL

(75) Inventors: Takayuki Takasugi, Sakai (JP); Yasuyuki Kaneno, Sakai (JP)

(73) Assignee: Osaka Prefecture University Public Corporation, Osaka (JP)

( * ) Notice: Subject to any disclaimer, the term of this patent is extended or adjusted under 35 U.S.C. 154(b) by 1403 days.

(21) Appl. No.: 11/886,183

(22) PCT Filed: Mar. 24, 2006

(86) PCT No.: PCT/JP2006/306027
§ 371 (c)(1),
(2), (4) Date: Sep. 12, 2007

(87) PCT Pub. No.: WO2006/101212
PCT Pub. Date: Sep. 28, 2009

(65) Prior Publication Data
US 2008/0175745 A1    Jul. 24, 2008

(30) Foreign Application Priority Data

Mar. 25, 2005  (JP) ................................. 2005-089357
Feb. 15, 2006  (JP) ................................. 2006-038307

(51) Int. Cl.
*C22C 19/03*    (2006.01)
*C22F 1/10*     (2006.01)

(52) U.S. Cl.
USPC ............................ 148/429; 420/460; 148/675

(58) Field of Classification Search
USPC ................................... 420/460; 148/429, 675
See application file for complete search history.

(56) References Cited

U.S. PATENT DOCUMENTS 4,478,791 A    10/1984  Huang et al.
5,328,530 A *   7/1994  Semiatin et al. .............. 148/559

FOREIGN PATENT DOCUMENTS

JP    62-274040 A    11/1987
JP    2 078 763 A1    7/2009

OTHER PUBLICATIONS

Tomihisa et al., "Phase relation and microstructure in Ni₃Al-Ni₃Ti-Ni₃Nb pseudo-ternary alloy system," Intermetallics, vol. 10, 2002, pp. 247-254.
Nunomura et al., "Ni₃Al-Ni₃Ti-Ni₃V Gisangen Gokin ni Okeru Bisai Niju Fukuso Soshiki Keisei," The Japan Institute of Metals Koen Gaiyo, vol. 134, 2004, pp. 408.

(Continued)

*Primary Examiner* — Jesse Roe
(74) *Attorney, Agent, or Firm* — Birch, Stewart, Kolasch & Birch, LLP

(57) ABSTRACT

An intermetallic compound having excellent mechanical properties at high temperatures is provided. An intermetallic compound of the present invention contains greater than 5 at % and not greater than 13 at % of Al, not less than 9.5 at % and less than 17.5 at % of V, not less than 0 at % and not greater than 3.5 at % of Ti, not less than 0 weight ppm and not greater than 1000 weight ppm of B, and the remaining portion consisting of Ni and inevitable impurities, and having a dual multi-phase microstructure comprising a primary $L1_2$ phase and an ($L1_2+D0_{22}$) eutectoid microstructure.

11 Claims, 15 Drawing Sheets

(56) References Cited

OTHER PUBLICATIONS

Nunomura et al., "$Ni_3Al$-$Ni_3Ti$-$Ni_3V$ Gisangenkei Gokin no Soshiki to Kikaiteki Seishitsu," The Japan Institute of Metals Koen Gaiyo, vol. 133, 2003, pp. 242.

Nunomura et al., "Phase relation and microstructure in multi-phase intermetallic alloys based on $Ni_3Al$-$Ni_3Ti$-$Ni_3V$ pseudo-ternary alloy system," Intermetallics, vol. 12, 2004, pp. 389-399.

Examination Report issued on Aug. 25, 2010 in related British patent application No. GB0813558.4.

* cited by examiner

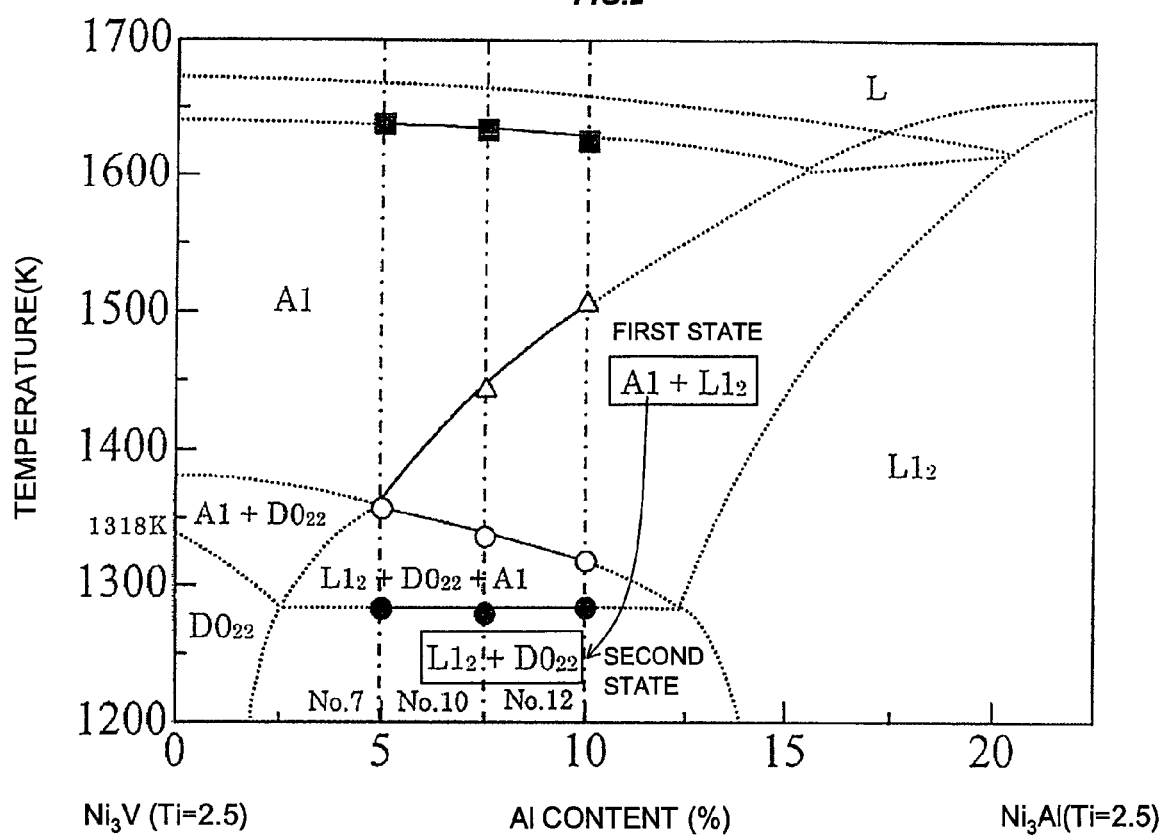

▲ PREPARED ALLOY COMPOSITION
● EQUILIBRATING ALLOY COMPOSITION
— SOLUBILITY LINE

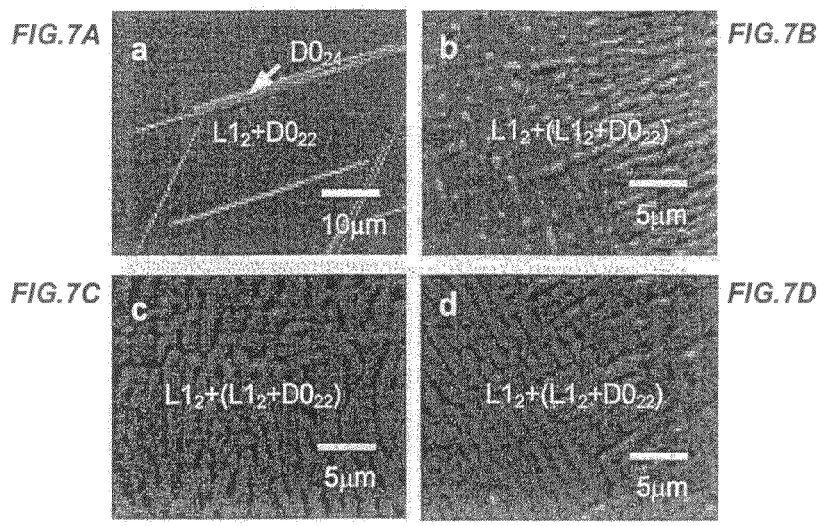
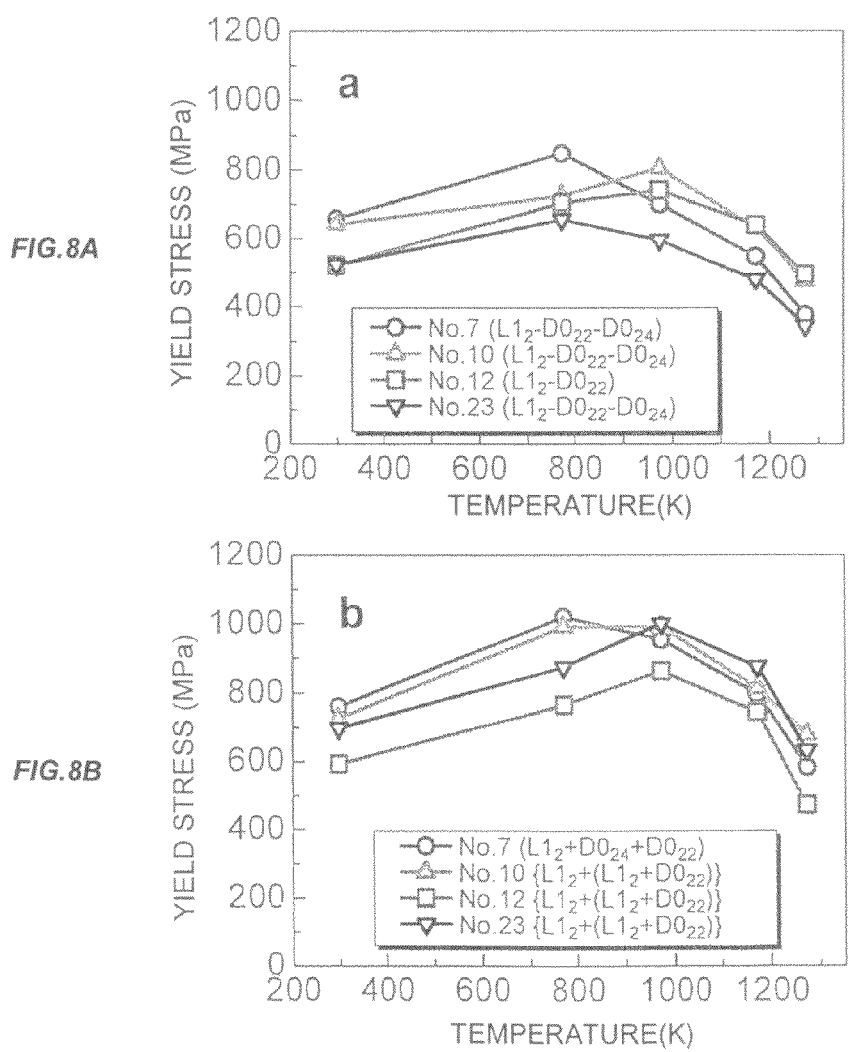

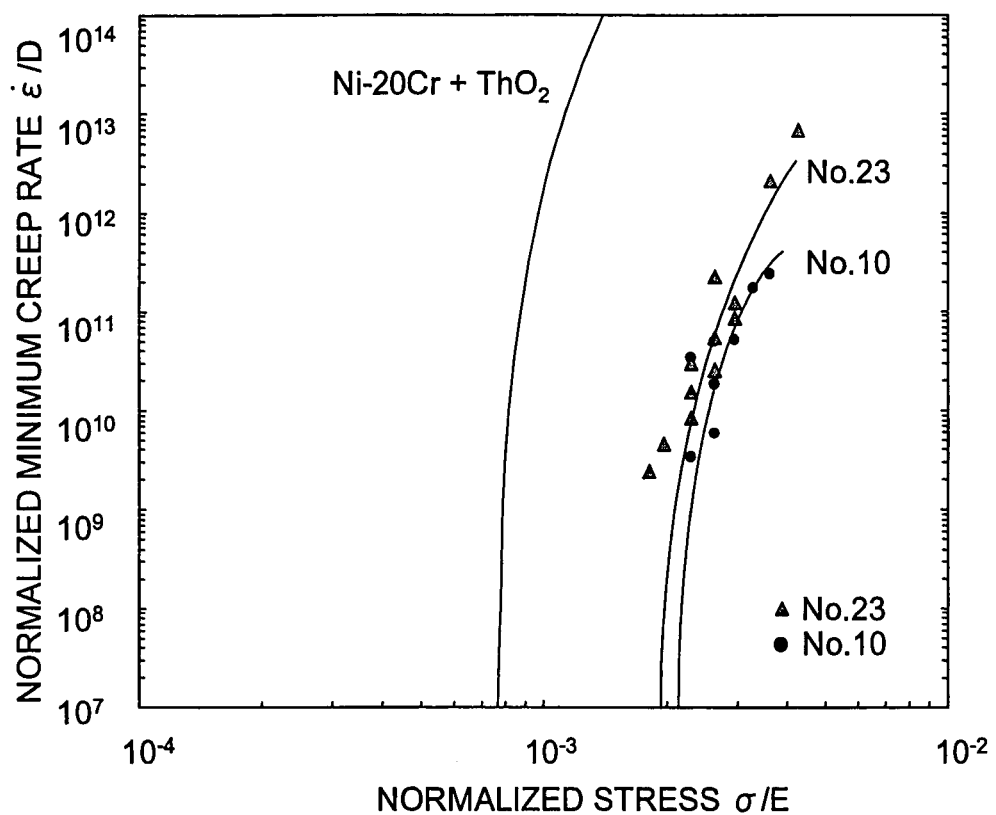

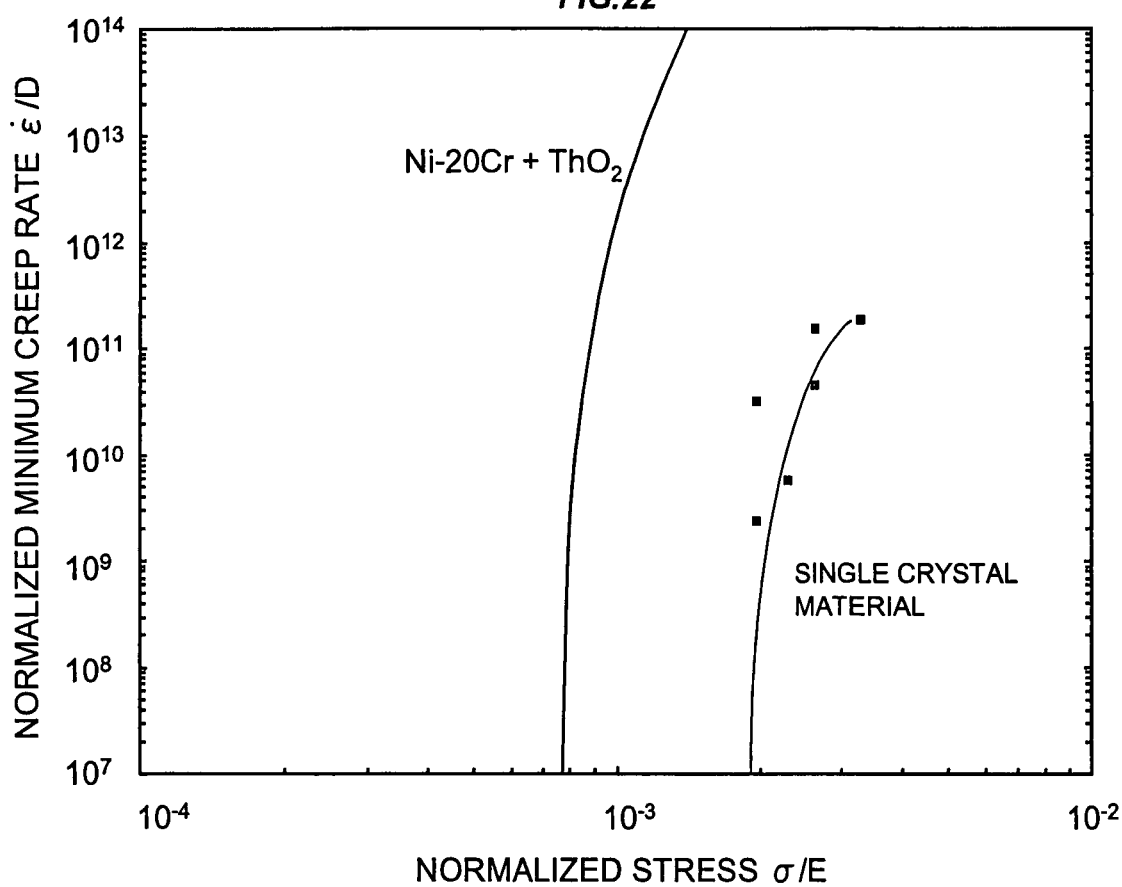

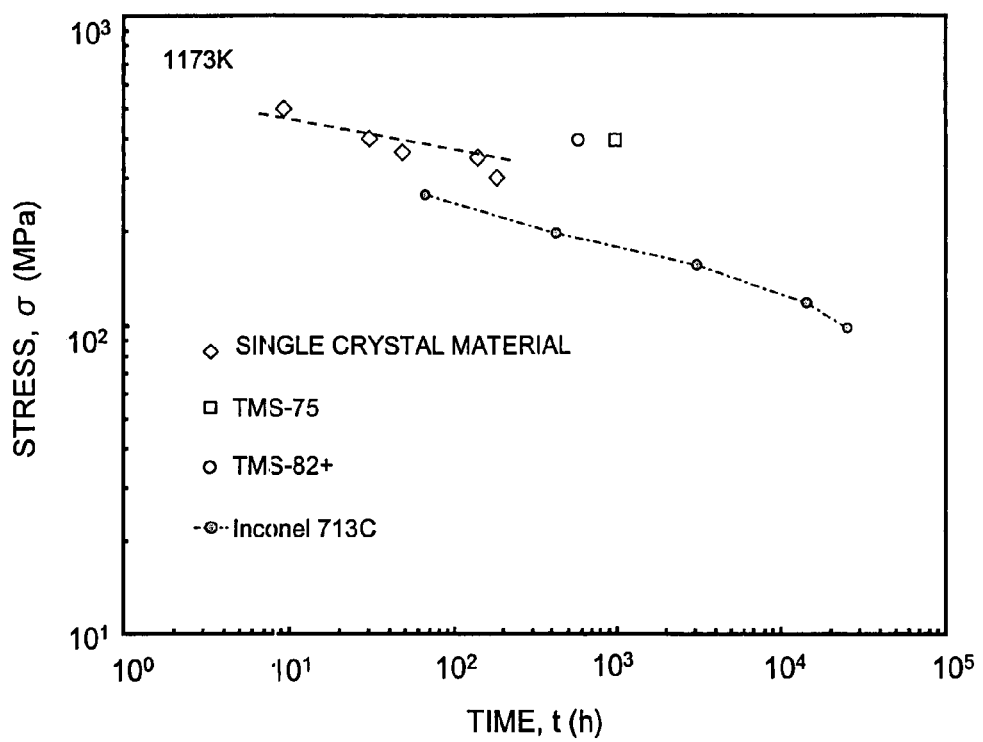
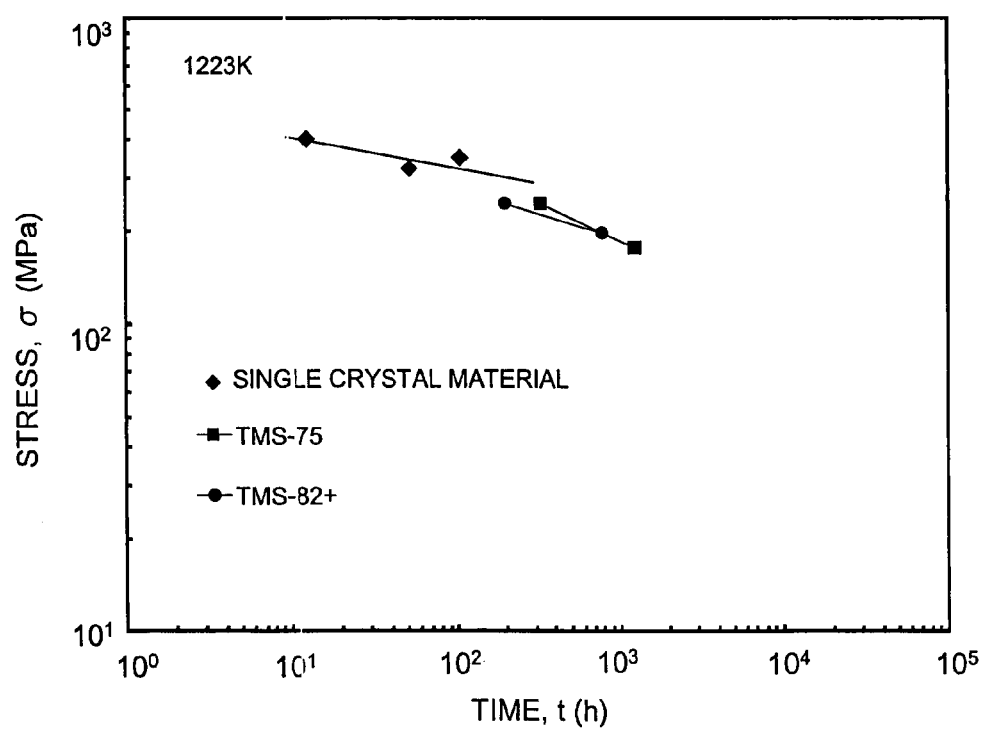

NI₃AL-BASED INTERMETALLIC COMPOUND WITH DUAL MULTI-PHASE MICROSTRUCTURE, PRODUCTION METHOD THEREOF, AND HEAT RESISTANT STRUCTURAL MATERIAL

TECHNICAL FIELD

The present invention relates to a $Ni_3Al$-based intermetallic compound with a dual multi-phase microstructure, a production method thereof, and a heat resistant structural material.

BACKGROUND ART

Nowadays, Ni-based superalloys are widely used as high-temperature structural materials for turbine parts of jet engines and gas turbines, etc. The Ni-based superalloys contain metallic phases ($\gamma$) exceeding a volume fraction of above 35 vol. % as a constituent phase, and consequently have limitations in melting point and high-temperature creep strength. Intermetallic compounds showing a positive temperature dependence of yield stress are promising materials as the high-temperature structural materials superior to the conventional Ni-based superalloys. However, monolithic intermetallic compounds have drawbacks of poor ductility at ambient temperature and also low creep strength at high temperature. $Ni_3X$ type intermetallic compounds have a GCP (geometrically closed packaged) crystal structure, and some of such compounds may be used in combination with high coherency. Many of the $Ni_3X$ type intermetallic compounds have excellent properties. Therefore, by using the $Ni_3X$ type intermetallic compounds, a new type of multi-phase intermetallic compounds (multi-phase intermetallics) having further excellent properties and a high freedom for microstructural control are expected to be produced.

An attempt has been made to develop a multi-phase intermetallic compound composed of $Ni_3Al(L1_2)$-$Ni_3Ti(D0_{24})$-$Ni_3Nb(D0_a)$ system, and it was found that an alloy having excellent properties can be developed (see Non-Patent Document 1).

Non-Patent Document 1: K. Tomihisa, Y. Kaneno, T. Takasugi, Intermetallics, 10 (2002)247

DISCLOSURE OF THE INVENTION

Problems to be Solved by the Invention

It is desirable to provide a material more excellent in mechanical properties than the aforementioned alloys.

In view of the foregoing, the present invention provides an intermetallic compound with excellent mechanical properties at high temperatures.

Means for Solving the Problems and Effects of the Invention

According to the present invention, there is provided an $Ni_3Al$-based intermetallic compound (hereinafter referred to simply as "intermetallic compound") which comprises greater than 5 at % and not greater than 13 at % of Al, not less than 9.5 at % and less than 17.5 at % of V, not less than 0 at % and not greater than 3.5 at % of Ti, not less than 0 weight ppm and not greater than 1000 weight ppm of B, and the remaining portion consisting of Ni and inevitable impurities, and has a dual multi-phase microstructure comprising a primary $L1_2$ phase and an ($L1_2+D0_{22}$) eutectoid microstructure.

It has been experimentally confirmed that the inventive intermetallic compound shows a dual multi-phase microstructure and exhibits an excellent mechanical properties at high temperatures as will be described later.

BRIEF DESCRIPTION OF THE DRAWINGS

FIG. 1B is an enlarged image of FIG. 1A for explaining the dual multi-phase microstructure of the inventive intermetallic compound.

FIG. 2 shows a longitudinal phase diagram of specific examples of the inventive intermetallic compound having a Ti content of 2.5 at % and a V content of (22.5—Al content) at % with the Al content and the temperature being plotted as abscissa and ordinate, respectively, for explaining the dual multi-phase microstructure of the inventive intermetallic compound.

FIGS. 7A to 7D show SEM (scanning electron microscope) images of cast materials of No. 7, No. 10, No. 12 and No. 23, respectively, as specific examples of the inventive intermetallic compound, which were annealed at 1373 K for 2 days followed by water-quenching.

FIG. 8A is a graph showing relationships between yield stress and temperature obtained from a compression test for the cast materials of No. 7, No. 10, No. 12 and No. 23, as specific examples of the inventive intermetallic compound, which were annealed at 1273 K for 7 days followed by water-quenching, and FIG. 8B is a graph showing relationships between yield stress and temperature obtained from a compression test for the cast materials of No. 7, No. 10, No. 12 and No. 23, as specific examples of the inventive intermetallic compound, which were annealed at 1373 K for 2 days followed by water-quenching.

FIG. 10 is a graph showing relationships between normalized minimum creep rate and normalized stress obtained from a high temperature compression creep test for the cast materials of No. 10 and No. 23, as the specific examples of the inventive intermetallic compound, which were annealed at 1373 K for 2 days followed by water-quenching.

FIG. 12B is a partial enlarged image of FIG. 12A.

FIG. 22 is a graph showing a relationship between normalized minimum creep rate and normalized stress for the single crystal material of No. 10, as the specific example of the inventive intermetallic compound, which was annealed at 1373 K for 10 hours and then at 1273 K for 10 hours.

FIGS. 23A and 23B are graphs showing relationships between stress and creep rupture life at 1173 K and 1223 K, respectively, for the single crystal material of No. 10, as the specific example of the inventive intermetallic compound, which was annealed at 1373 K for 10 hours and then at 1273 K for 10 hours.

BEST MODE FOR CARRYING OUT THE INVENTION

The inventive intermetallic compound comprises greater than 5 at % and not greater than 13 at % of Al, not less than 9.5 at % and less than 17.5 at % of V, not less than 0 at % and not greater than 3.5 at % of Ti, not less than 0 weight ppm and not greater than 1000 weight ppm of B, and the remaining portion consisting of Ni and inevitable impurities, and has a dual multi-phase microstructure comprising a primary $L1_2$ phase and an ($L1_2$+$D0_{22}$) eutectoid microstructure.

The intermetallic compound is fabricated by a method comprising the steps of: performing a first heat treatment to heat-treat an alloy material comprising greater than 5 at % and not greater than 13 at % of Al, not less than 9.5 at % and less than 17.5 at % of V, not less than 0 at % and not greater than 3.5 at % of Ti, not less than 0 weight ppm and not greater than 1000 weight ppm of B, and the remaining portion consisting of Ni and inevitable impurities at a primary $L1_2$ phase/Al phase coexistence temperature at which a primary $L1_2$ phase and an Al phase coexist; and cooling the resulting alloy material to an $L1_2$ phase/$D0_{22}$ phase coexistence temperature at which an $L1_2$ phase and a $D0_{22}$ phase coexist, or performing a second heat treatment to heat-treat the resulting alloy material at the $L1_2$ phase/$D0_{22}$ phase coexistence temperature, whereby the Al phase is transformed into an ($L1_2$+$D0_{22}$) eutectoid structure to form a dual multi-phase microstructure.

Figure 1A:
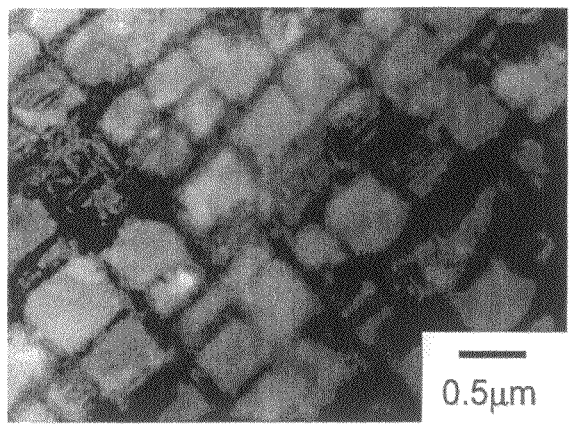
FIGS. 1A and 1B show images of a specific example of the inventive intermetallic compound taken by a TEM (transmission electron microscope)
Figure 1B:
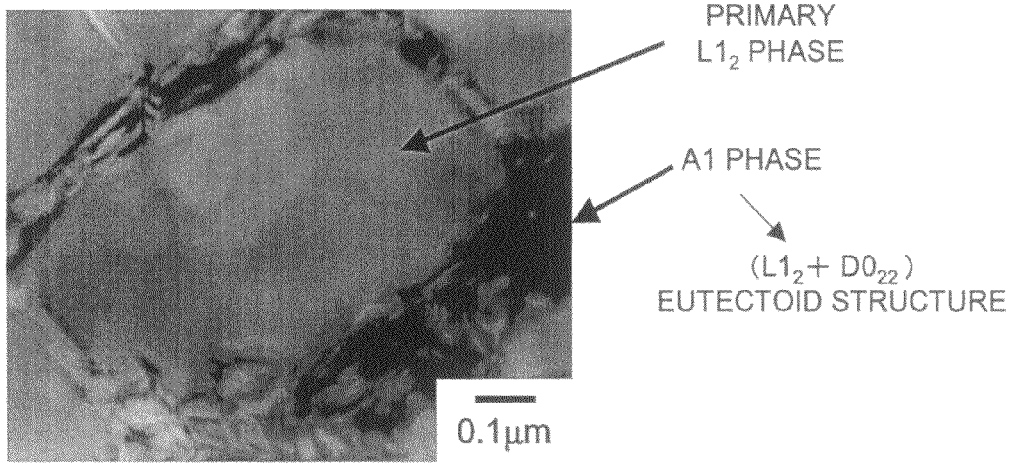

Here, the dual multi-phase microstructure and the production method thereof will be described with reference to TEM images (FIGS. 1A and 1B) and a longitudinal phase diagram (FIG. 2). FIGS. 1A and 1B are TEM images of a specific example of the inventive intermetallic compound. FIG. 1B is an enlarged image of FIG. 1A. FIG. 2 is a longitudinal phase diagram for specific examples of the inventive intermetallic compound with the Al content and the temperature being plotted as abscissa and ordinate, respectively. The Ti content is a value of 2.5 at %, and the V content is (22.5—Al content) at %.

First, the alloy material is subjected to the first heat treatment. The first heat treatment is performed at a primary $L1_2$ phase/Al phase coexistence temperature. Specifically, the primary $L1_2$ phase/Al phase coexistence temperature is a temperature at which the alloy material is in a first state shown in FIG. 2, i.e., a temperature in a range defined between plots ○ and Δ in FIG. 2. The $L1_2$ phase is $Ni_3Al$ intermetallic phase, and the Al phase is an fcc solid solution phase. Referring to FIGS. 1A and 1B, a cuboidal primary $L1_2$ phase is dispersed, and an Al phase exists between the primary $L1_2$ phase and the primary $L1_2$ phase. A microstructure comprising the primary $L1_2$ phase and a phase between the primary $L1_2$ phase and the primary $L1_2$ phase is hereinafter referred to as "upper multi-phase microstructure."

A period for the first heat treatment is not particularly limited, but preferably a period sufficient to impart the entire alloy material with the microstructure comprising the primary $L1_2$ phase and the Al phase. The period for the first heat treatment is, for example, about 5 to about 20 hours.

Next, the alloy material subjected to the first heat treatment is cooled to the $L1_2$ phase/$D0_{22}$ phase coexistence temperature, or further subjected to the second heat treatment at the $L1_2$ phase/$D0_{22}$ phase coexistence temperature. The cooling may be natural cooling or forcible cooling such as water-quenching. The natural cooling may be achieved, for example, by taking out the alloy material from a heat treatment furnace after the first heat treatment and then allowing the resulting alloy material to be put at room temperature, or by turning off a heater of the heat treatment furnace after the first heat treatment and then allowing the resulting alloy material to be put in the heat treatment furnace. A temperature for the second heat treatment is, for example, about 1173 to about 1273 K. A period for the second heat treatment is, for example, about 5 to 20 hours. The Al phase may be decomposed into the $L1_2$ phase and the $D0_{22}$ phase by the cooling such as the water-quenching without the second heat treatment. However, the decomposition can be more reliably achieved by the heat treatment at the relatively high temperature. After the second heat treatment, the resulting alloy material may be cooled to the room temperature by natural cooling or forcible cooling. A range expressed by "A to B" or "between A and B" wherein A and B are boundary values is herein intended to include the boundary values A and B.

The $L1_2$ phase/$D0_{22}$ phase coexistence temperature is a temperature at which the alloy material is in a second state shown in FIG. 2, i.e., a temperature not higher than a temperature defined by plots ● in FIG. 2 (in FIG. 2, 1281 K, which may vary depending on the composition of the alloy material). The cooling to the $L1_2$ phase/$D0_{22}$ phase coexistence temperature or the second heat treatment at the $L1_2$ phase/$D0_{22}$ phase coexistence temperature hardly influences the primary $L1_2$ phase, but decomposes the Al phase into the $L1_2$ phase and the $D0_{22}$ phase. A multi-phase microstructure comprising the $L1_2$ phase and the $D0_{22}$ phase provided by the decomposition of the Al phase is hereinafter referred to as "lower multi-phase microstructure."

The inventive intermetallic compound has the dual multi-phase microstructure including the upper multi-phase microstructure and the lower multi-phase microstructure. It has been experimentally confirmed that the inventive intermetallic compound is excellent in mechanical properties at high temperatures as will be described later. These excellent properties are supposed to be due to the dual multi-phase microstructure of the inventive intermetallic compound. Further, the inventive intermetallic compound includes the primary $L1_2$ phase, whose crystal structure is relatively simple compared with the other two constituent phases ($D0_{22}$ and $D0_{24}$), and thereby dislocations are relatively likely to be activated. Therefore, the inventive intermetallic compound is considered to be ductile to some extent in the entire temperature range including the room temperature. This advantageously ensures easy handing. Since the inventive intermetallic compound is excellent in mechanical properties at high temperatures, the intermetallic compound is usable as a heat resistant structural material.

A reason why the Al content is defined to be greater than 5 at % and not greater than 13 at % and the V content is defined to be not less than 9.5 at % and less than 17.5 at % is because the first heat treatment at the primary $L1_2$ phase/Al phase coexistence temperature and the cooling to the $L1_2$ phase/$D0_{22}$ phase coexistence temperature or the second heat treatment at the $L1_2$ phase/$D0_{22}$ phase coexistence temperature can result in the dual multi-phase microstructure as will be understood from the longitudinal phase diagram of FIG. 2 and the following specific examples.

The Al content is preferably 6 to 9 at %, more preferably 7 to 8 at %. The V content is preferably 13.5 to 16.5 at %, more preferably 14.5 to 15.5 at %.

A specific value of the Al content (content percentage) may be, for example, 5.5, 6, 6.5, 7, 7.5, 8, 8.5, 9, 9.5, 10, 10.5, 11, 11.5, 12, 12.5 or 13 at %.

A specific value of the V content may be, for example, 9.5, 10, 10.5, 11, 11.5, 12, 12.5, 13, 13.5, 14, 14.5, 15, 15.5, 16, 16.5 or 17 at %. The Al content and the V content may each take a value between any two values of the aforementioned specific values.

The Ti content is not less than 0 at % and not greater than 3.5 at %, preferably not less than 0.5 at % and not greater than 3.5 at %, more preferably 1 to 3.5 at %, further more preferably 2 to 3 at %. The intermetallic compound or the alloy material according to the present invention preferably contains Ti, but may contain no Ti. A specific value of the Ti content may be, for example, 0, 0.5, 1, 1.5, 2, 2.5, 3 or 3.5 at %. The Ti content may take a value between any two values of the aforementioned specific values.

The Ni content is preferably 73 to 77 at %, more preferably 74 to 76 at %. With the Ni content being in this range, the ratio of the Ni content and the total of the Al, Ti and V contents is close to 3:1, so that a solid solution phase of Ni, Al, Ti or V is hardly present. A specific value of the Ni content may be, for example, 73, 73.5, 74, 74.5, 75, 75.5, 76, 76.5 or 77 at %. The Ni content may take a value between any two values of the aforementioned specific values.

Specific examples of the composition of the inventive intermetallic compound include: 73Ni-1Al-17V, 73Ni-13Al-14V, 73Ni-7.5Al-17V-2.5Ti, 73Ni-1Al-14.5V-2.5Ti, 73Ni-13Al-11.5V-2.5Ti, 73Ni-7Al-16.5V-3.5Ti, 73Ni-10Al-13.5V-3.5Ti and 73Ni-13Al-10.5V-3.5Ti;

75Ni-8Al-17V, 75Ni-10Al-15V, 75Ni-13Al-12V, 75Ni-5.5Al-17V-2.5Ti, 75Ni-9.5Al-13V-2.5Ti, 75Ni-13Al-9.5V-2.5Ti, 75Ni-5.5Al-16V-3.5Ti, 75Ni-9Al-12.5V-3.5Ti and 75Ni-12Al-9.5V-3.5Ti; and 77Ni-6Al-17V, 77Ni-9Al-14V, 77Ni-13Al-10V, 77Ni-5.5Al-15V-2.5Ti, 77Ni-8Al-12.5V-2.5Ti, 77Ni-11Al-9.5V-2.5Ti, 77Ni-5.5Al-14V-3.5Ti, 77Ni-8Al-11.5V-3.5Ti and 77Ni-10Al-9.5V-3.5Ti;

wherein a numeral preceding each element means a percentage of the element in atomic percentage (at %).

The B content is not less than 0 weight ppm and not greater than 1000 weight ppm, preferably 50 to 1000 weight ppm, more preferably 200 to 800 weight ppm, further more preferably 400 to 600 weight ppm. The intermetallic compound or the alloy material according to the present invention preferably contains B, but may contain no B. A specific value of the B content may be, for example, 0, 50, 100, 150, 200, 250, 300, 350, 400, 450, 500, 550, 600, 650, 700, 750, 800, 850, 900, 950 or 1000 weight ppm. The B content may take a value between any two values of the aforementioned specific values.

Examples of the alloy material to be used for the production of the inventive intermetallic compound include a cast material, a forged material and a single crystal material. The cast material may be prepared by melting preliminarily weighed metals (by arc melting, high-frequency induction melting or the like) and then casting into a mold. Generally, the cast material is a polycrystalline material which includes a number of crystal grains with grain sizes of the order of several hundreds microns to several millimeters and is disadvantageously liable to suffer from breakage in boundaries between crystal grains (crystal grain boundaries) or cast defects such as shrinkage cavities. The forged material overcomes these disadvantages. The forged material is prepared by hot forging and subsequent recrystallization annealing of the cast material. The hot forging and the recrystallization annealing are typically carried out at a higher temperature than the first heat treatment. The hot forging temperature and the recrystallization annealing temperature may be the same or different. Preferably, the hot forging is carried out at about 1523 to about 1623 K, and the recrystallization annealing is carried out at about 1423 to about 1573 K.

Prior to the first heat treatment, the alloy material may be subjected to a heat treatment for homogenization. The homogenization heat treatment is typically carried out at a higher temperature than the first heat treatment. The homogenization heat treatment is preferably conducted at about 1523 to about 1623 K. However, the first heat treatment may be performed simultaneously with the homogenization heat treatment. For the preparation of the forged material, the hot forging and the recrystallization annealing may be carried out simultaneously with the homogenization heat treatment. A period for the homogenization heat treatment is not particularly limited, but typically about 24 to about 96 hours, for example.

Where the alloy material is the polycrystalline material (the cast material or the forged material), it is particularly preferred that the alloy material contains B. Boron strengthens the crystal grain boundaries.

A compression test and a tensile test were performed on the heat-treated cast material, forged material and single material with a dual multi-phase microstructure, and it was consequently confirmed that these intermetallic compounds are excellent in mechanical properties.

EXAMPLES

The inventive intermetallic compound will hereinafter be explained by way of various specific examples thereof. The following specific examples of the intermetallic compound with a dual multi-phase microstructure were prepared by heat-treating: (1) cast materials; (2) forged materials; and (3) a single crystal material, and the mechanical properties of the resulting intermetallic compounds were examined.

For the following specific examples, a heat treatment at 1373 K corresponds to the first heat treatment at the primary $L1_2$ phase/Al phase coexistence temperature, and water-quenching following the heat treatment at 1373 K corresponds to the cooling to the $L1_2$ phase/$D0_{22}$ phase coexistence temperature. A heat treatment at 1173 K or 1273 K following the heat treatment at 1373 K corresponds to the second heat treatment at the $L1_2$ phase/$D0_{22}$ phase coexistence temperature.

The formation of the dual multi-phase microstructure in the following specific examples discussed in "1-4. Phase Diagram at 1373 K" to "1-6. High Temperature Creep Test" is achieved by the first heat treatment at 1373 K and the subsequent water quenching. On the other hand, the formation of the dual multi-phase structure discussed in "1-7. Structural Change by Aging Heat Treatment and Mechanical Properties" "2. Forged Materials" and "3. Single Crystal Material" was achieved by the first heat treatment at 1373 K and the subsequent second heat treatment at 1173 K or at 1273 K.

1. Cast Materials 1-1. Method of Preparing Cast Materials

Cast materials were prepared by melting raw metals of Ni, Al, Ti and V (each having a purity of 99.9 wt %) in proportions as shown in the rows of No. 1 to No. 23 in Table 1 in an arc melting furnace. A melting chamber of the arc melting furnace was first evacuated, and the atmosphere in the arc melting furnace is replaced with an inert gas (argon gas). Non-consumable tungsten electrodes were employed as electrodes of the furnace, and a water-cooling copper hearth was employed as a mold. In the following description, the cast materials will be referred to simply as Samples.

In Table 1, Samples No. 10, No. 12 and No. 23 were examples of the present invention.

The samples according to the examples of the present invention are located in: (1) a two-phase coexistence region including an $L1_2$ phase and an Al phase or a three-phase coexistence region including an $L1_2$ phase, an Al phase and a $D0_{24}$ phase in a phase diagram at 1373 K shown in FIG. 6 to be described later; and (2) a two-phase coexistence region including an $L1_2$ phase and a $D0_{22}$ phase or a three-phase coexistence region including an $L1_2$ phase, a $D0_{22}$ phase and a $D0_{24}$ phase in a phase diagram at 1273 K shown in FIG. 3 to be described later.

These samples are each imparted with the dual multi-phase microstructure by: (1) forming the primary $L1_2$ phase and the Al phase through the first heat treatment at the relatively high temperature; and (2) decomposition of the Al phase into the $L1_2$ phase and the $D0_{22}$ phase or into the $L1_2$ phase, the $D0_{22}$ phase and the $D0_{24}$ phase through the subsequent cooling or the subsequent heat treatment at the relatively low temperature.

TABLE 1

| Sample | Composition of Sample (at. %) | | | | Microstructure | $L1_2$ ($Ni_3Al$) (at %) | | | | $D0_{24}$ ($Ni_3Ti$) (at %) | | | |
|---|---|---|---|---|---|---|---|---|---|---|---|---|---|
| No. | Ni | Al | Ti | V | at 1273K | Ni | Al | Ti | V | Ni | Al | Ti | V |
| 1 | 75 | 2.5 | 17.5 | 5 | $D0_{24}$ | — | — | — | — | 72.9 | 2.3 | 19.5 | 5.3 |
| 2 | 75 | 2.5 | 12.5 | 10 | rho + $D0_{22}$ | — | — | — | — | — | — | — | — |
| 3 | 75 | 2.5 | 7.5 | 15 | rho + $D0_{22}$ | — | — | — | — | — | — | — | — |
| 4 | 75 | 5 | 17.5 | 2.5 | $D0_{24}$ | — | — | — | — | 72.8 | 4.2 | 19.5 | 3.4 |
| 5 | 75 | 5 | 12.5 | 7.5 | $D0_{24}$ + $D0_{22}$ | — | — | — | — | 73.6 | 4.8 | 13.9 | 7.7 |
| 6 | 75 | 5 | 7.5 | 12.5 | $D0_{24}$ + $D0_{22}$ + rho | — | — | — | — | ND | ND | ND | ND |
| 7 | 75 | 5 | 2.5 | 17.5 | $L1_2$ + $D0_{24}$ + $D0_{22}$ | ND | ND | ND | ND | ND | ND | ND | ND |
| 8 | 75 | 7.5 | 12.5 | 5 | $L1_2$ + $D0_{24}$ | 73.9 | 9.0 | 12.6 | 4.5 | 73.5 | 6.6 | 13.8 | 6.1 |
| 9 | 75 | 7.5 | 7.5 | 10 | $D0_{24}$ | — | — | — | — | 74.3 | 7.2 | 6.8 | 11.8 |
| 10 | 75 | 7.5 | 2.5 | 15 | $L1_2$ + $D0_{24}$ + $D0_{22}$ | ND | ND | ND | ND | 74.7 | 7.8 | 3.5 | 14.0 |
| 11 | 75 | 10 | 7.5 | 7.5 | $L1_2$ + $D0_{24}$ | 74.0 | 10.6 | 7.3 | 8.0 | 74.0 | 7.0 | 8.0 | 11.0 |
| 12 | 75 | 10 | 2.5 | 12.5 | $L1_2$ + $D0_{22}$ | ND | ND | ND | ND | — | — | — | — |
| 13 | 75 | 1.25 | 11.3 | 12.5 | rho + $D0_{22}$ | — | — | — | — | — | — | — | — |
| 14 | 75 | 1.25 | 7.5 | 16.25 | rho + $D0_{22}$ | — | — | — | — | — | — | — | — |

TABLE 1-continued

| | | | | | | | | | | | | |
|---|---|---|---|---|---|---|---|---|---|---|---|---|
| 15 | 75 | 1.25 | 2.5 | 21.25 | $DO_{22}$ | — | — | — | — | — | — | — | — |
| 16 | 75 | 2.5 | 15 | 7.5 | $DO_{24}$ + rho | — | — | — | — | 73.6 | 2.5 | 17.2 | 6.8 |
| 17 | 75 | 2.5 | 5 | 17.5 | $DO_{22}$ | — | — | — | — | — | — | — | — |
| 18 | 75 | 7.5 | 15 | 2.5 | $L1_2 + DO_{24}$ | 73.5 | 8.5 | 14.4 | 3.6 | 73.1 | 6.4 | 16.8 | 3.8 |
| 19 | 75 | 7.5 | 5 | 12.5 | $DO_{24}$ | — | — | — | — | 73.6 | 7.2 | 5.7 | 13.4 |
| 20 | 75 | 10 | 5 | 10 | $L1_2 + DO_{24}$ | ND | ND | ND | ND | ND | ND | ND | ND |
| 21 | 75 | 5 | 10 | 10 | $DO_{24}$ + rho | — | — | — | — | ND | ND | ND | ND |
| 22 | 75 | 5 | 5 | 15 | $DO_{24} + DO_{22}$ | — | — | — | — | ND | ND | ND | ND |
| 23 | 75 | 8.75 | 3.13 | 13.13 | $L1_2 + DO_{24} + DO_{22}$ | ND | ND | ND | ND | 72.3 | 9.3 | 4.1 | 14.1 |

| Sample No. | $DO_{22}$ ($Ni_3V$) (at %) | | | | Rho ($Ni_3Ti_{0.7}V_{0.3}$) (at %) | | | |
|---|---|---|---|---|---|---|---|---|
| | Ni | Al | Ti | V | Ni | Al | Ti | V |
| 1 | — | — | — | — | — | — | — | — |
| 2 | 73.1 | 1.0 | 7.8 | 18.1 | 73.8 | 2.4 | 13.8 | 10.1 |
| 3 | 70.6 | 2.8 | 8.7 | 18.0 | 72.3 | 3.0 | 13.5 | 11.2 |
| 4 | — | — | — | — | — | — | — | — |
| 5 | 72.6 | 2.2 | 6.0 | 19.1 | — | — | — | — |
| 6 | ND | ND | ND | ND | 74.8 | 3.7 | 10.8 | 10.8 |
| 7 | ND | ND | ND | ND | — | — | — | — |
| 8 | — | — | — | — | — | — | — | — |
| 9 | — | — | — | — | — | — | — | — |
| 10 | ND | ND | ND | ND | — | — | — | — |
| 11 | — | — | — | — | — | — | — | — |
| 12 | ND | ND | ND | ND | — | — | — | — |
| 13 | 73 | 0.7 | 8.5 | 17.8 | 73.2 | 1.2 | 14.1 | 11.6 |
| 14 | 73.6 | 1.1 | 6.2 | 19.1 | 73.7 | 1.6 | 13.5 | 11.2 |
| 15 | 74.1 | 0.7 | 2.2 | 23.1 | — | — | — | — |
| 16 | — | — | — | — | 73.1 | 2.7 | 15.6 | 8.6 |
| 17 | 73.9 | 1.8 | 4.3 | 19.9 | — | — | — | — |
| 18 | — | — | — | — | — | — | — | — |
| 19 | — | — | — | — | — | — | — | — |
| 20 | — | — | — | — | — | — | — | — |
| 21 | — | — | — | — | ND | ND | ND | ND |
| 22 | ND | ND | ND | ND | — | — | — | — |
| 23 | ND | ND | ND | ND | — | — | — | — |

Note:
rhombohedral is reffered to as "rho"

1-2. Phase Diagram at 1273 K

Samples No. 1 to No. 23 were sealed in an evacuated quartz tube, and then annealed at 1273 K for 7 days followed by water-quenching. Thereafter, the microstructures of Samples No. 1 to No. 23 were observed and the constituent phases of Samples No. 1 to No. 23 were analyzed for determination of a phase diagram at 1273 K. An OM (Optical Microscope), a SEM and a TEM were used for the observation of the microstructures, and a SEM-EPMA (Scanning Electron Microscope-Electron Probe Micro Analyzer) was used for the analysis of the constituent phases. The results of the observation and the analysis are shown in Table 1, and a $Ni_3Al$—$Ni_3Ti$—$Ni_3V$ pseudo-ternary system phase diagram at 1273 K obtained through the observation and the analysis is shown in FIG. 3.

Figure 3:
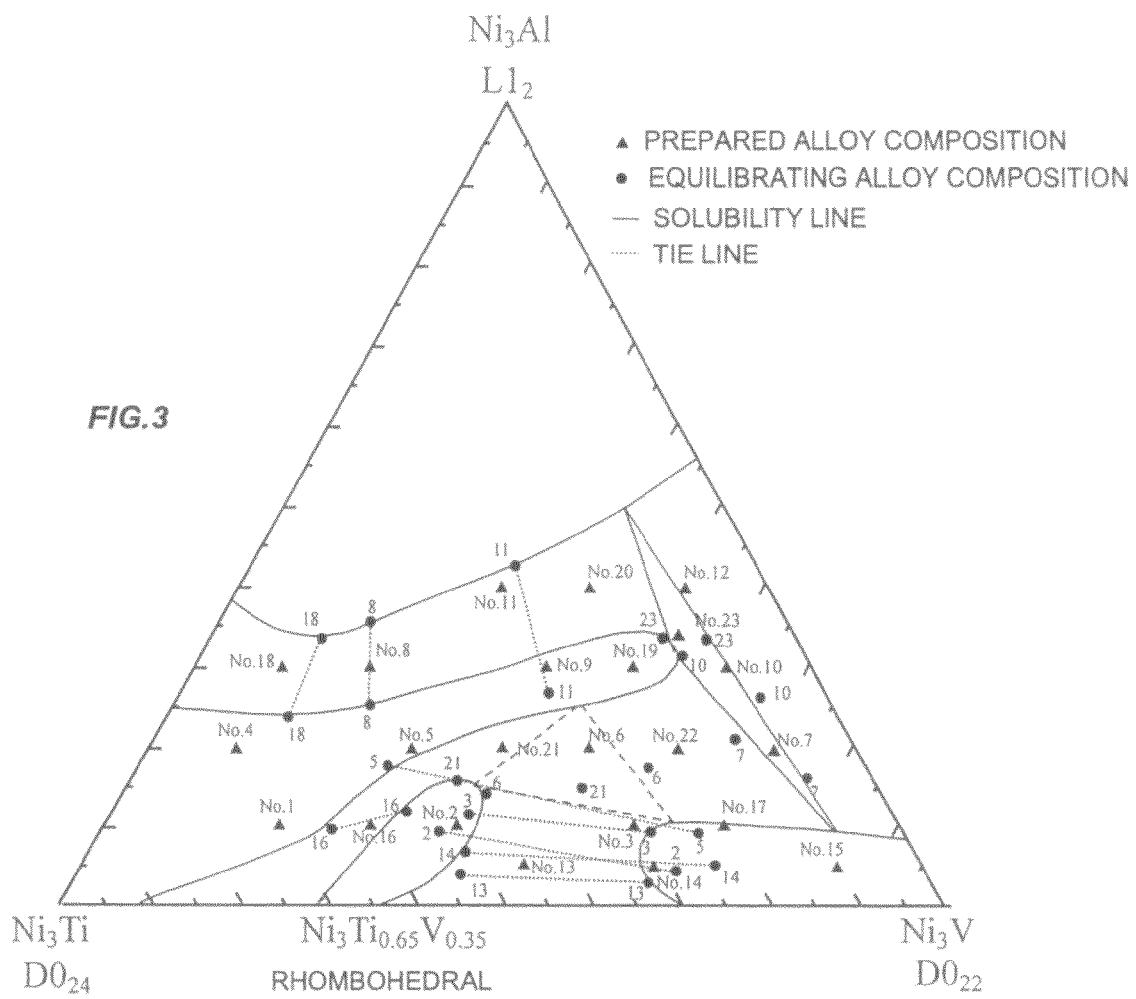
FIG. 3 shows a $Ni_3Al$—$Ni_3Ti$—$Ni_3V$ pseudo-ternary phase diagram at 1273 K prepared based on specific examples of the inventive intermetallic compound.
Figure 4A:
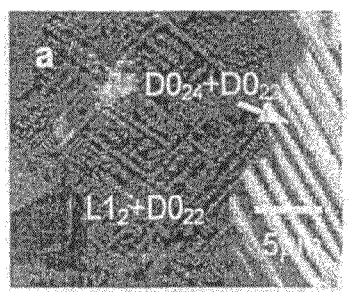
FIGS. 4A to 4D show SEM images of cast materials of No. 7, No. 10, No. 12 and No. 23, respectively, as specific examples of the inventive intermetallic compound, which were annealed at 1273 K for 7 days followed by water-quenching.
Figure 4B:
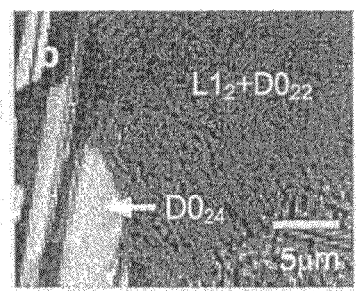
Figure 4C:
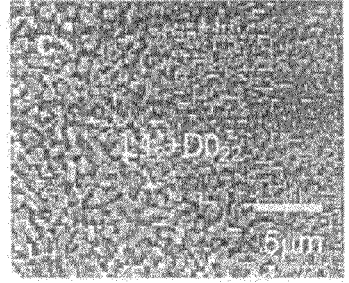
Figure 4D:
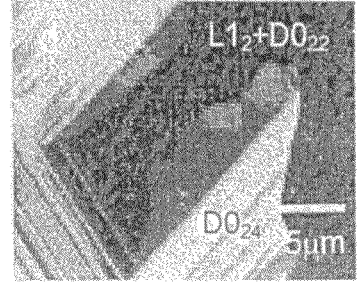

Table 1 and FIG. 3 show that phases other than the $L1_2$ phase, the $DO_{22}$ phase, the $DO_{34}$ phase and a rhombohedral phase are not present in any of Samples No. 1 to No. 23. These phases each contain Ni in a proportion of about 75 at %. These phases are in a single-phase or multi-phase equilibrium state. Five two-phase coexistence regions and two three-phase coexistence regions are observed. An $L1_2$-$DO_{22}$-$DO_{24}$ three-phase coexistence region present in a lower Ti content region is an interesting microstructure in which constituent phases present at three vertices in the phase diagram are directly equilibrated.

In turn, Samples No. 7, No. 10, No. 12 and No. 23 annealed at 1273 K for 7 days and the subsequent water quenching were each observed by the SEM. FIGS. 4A to 4D are SEM images of Samples No. 7, No. 10, No. 12 and No. 23, respectively. Fine eutectoid microstructure of ($L1_2+DO_{22}$) formed by a eutectoid reaction are observed in Samples No. 7, No. 10, No. 12 and No. 23. The $DO_{24}$ phase forms a lamellar structure together with the $DO_{22}$ phase, or is precipitated in a plate-like form.

1-3. Longitudinal Phase Diagram at 2.5 at % of Ti

Figure 5:
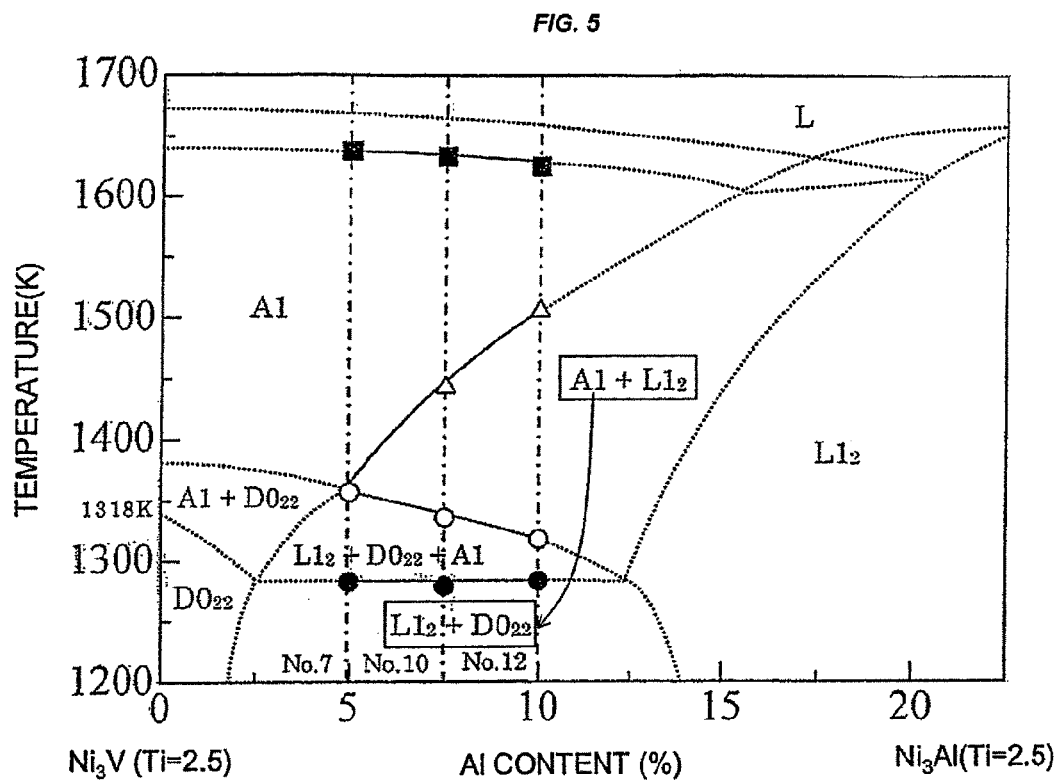
FIG. 5 shows a longitudinal phase diagram of specific examples of the inventive intermetallic compound having a Ti content of 2.5 at % and a V content of (22.5—Al content) at % with the Al content and the temperature being plotted as abscissa and ordinate, respectively.

In turn, samples each having a Ti content of 2.5 at % were analyzed through DSC (Differential Scanning Calorimetry). The resulting longitudinal phase diagram is shown in FIG. 5. In FIG. 5, the abscissa represents the Al content, and the ordinate represents the temperature. The V content is (22.5—Al content) at %.

As can be seen from the longitudinal phase diagram of FIG. 5, samples each having an Al content of greater than 5 at % and not greater than 13 at % each have an Ni-based superalloy microstructure including A1 and $L1_2$ phases at 1373 K and, when being cooled to a temperature not higher than a eutectoid point (1281 K), are each imparted with a dual multi-phase microstructure comprising a primary $L1_2$ phase and an ($L1_2+DO_{22}$) eutectoid microstructure by a eutectoid reaction Al→$L1_2+DO_{22}$.

1-4. Phase Diagram at 1373 K

Figure 6:
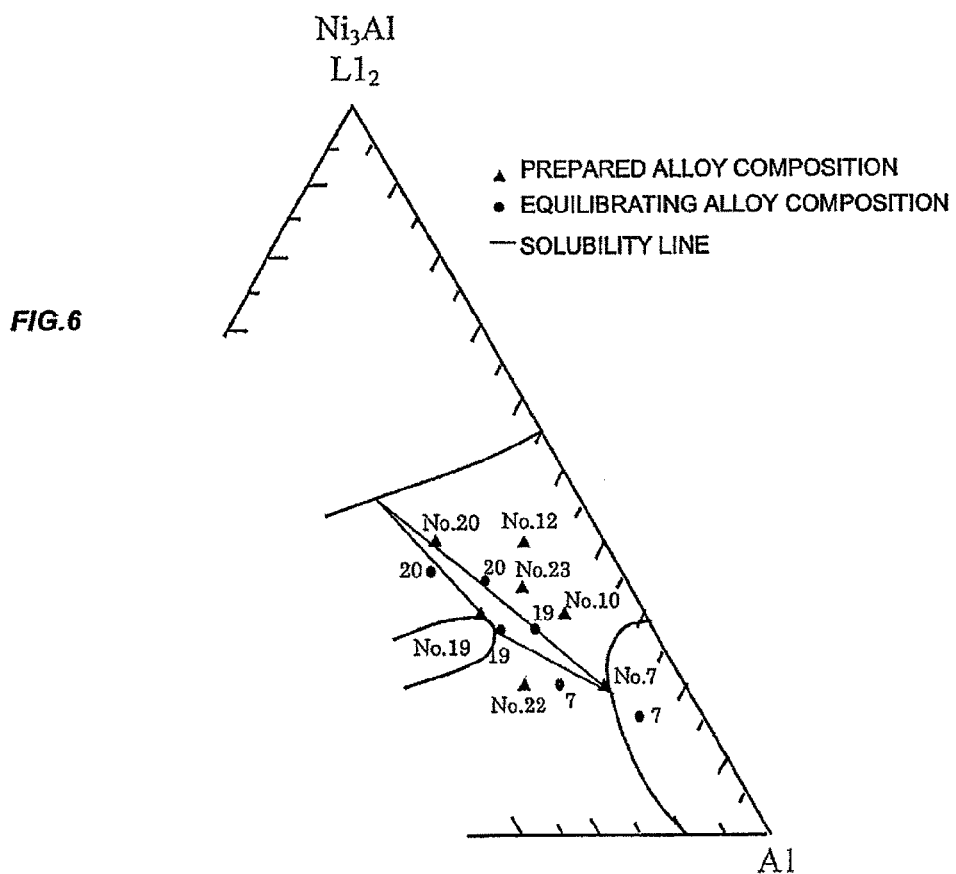
FIG. 6 shows a lower Ti content region of a $Ni_3Al$—$Ni_3Ti$—$Ni_3V$ pseudo-ternary phase diagram at 1373 K prepared based on various specific examples of the inventive intermetallic compound.

The samples prepared by the method described in "1-1. Method of Preparing Cast Materials" were each sealed in a quartz tube, and then annealed at 1373 K for 2 days followed by water-quenching. Thereafter, the microstructures of Samples No. 7, No. 10, No. 12, No. 19, No. 20, No. 22 and No. 23 were observed, and the constituent phases of Samples No. 7, No. 10, No. 12, No. 19, No. 20, No. 22 and No. 23 were analyzed for determination of a phase diagram at 1373 K. The OM, the SEM and the TEM were used for the observation of the microstructures, and the SEM-EPMA was used for the analysis of the constituent phases. A lower Ti content region of a $Ni_3Al$—$Ni_3Ti$—$Ni_3V$ pseudo-ternary system phase diagram at 1373 K obtained through the observation and the analysis is shown in FIG. 6. The $L1_2$-$D0_{22}$-$D0_{24}$ three-phase coexistence region is shifted toward a higher Ti content region as compared with the phase diagram of FIG. 3. Thus, the $D0_{24}$ phase is not observed in the microstructures of Samples No. 10 and No. 23. In the region where the Ti content is not greater than 3.5 at %, the Al phase and the $L1_2$ phase coexist in the inventive intermetallic compound, depending on the Al content and the V content.

In turn, Samples No. 7, No. 10, No. 12 and No. 23 annealed at 1373 K for 2 days and the subsequent water-quenched were each observed by the SEM. FIGS. 7A to 7D are SEM images of Samples No. 7, No. 10, No. 12 and No. 23, and correspond to FIGS. 4A to 4D, respectively. A fine ($L1_2$+$D0_{22}$) eutectoid microstructure formed by the eutectoid reaction is observed in each of Samples No. 7, No. 10, No. 12 and No. 23. The $D0_{34}$ phase forms a lamellar structure together with the $D0_{22}$ phase, or is precipitated in a plate-like form. As can be seen from FIGS. 7A to 7D, a primary $L1_2$ phase and an ($L1_2$+$D0_{22}$) eutectoid microstructure present in each of the samples having an Al content of greater than 5 at % and not greater than 13 at % are very fine, and arranged with proper directionality. It was confirmed by the TEM that the primary $L1_2$ phase is oriented along [100] and [010] directions. In Sample No. 7, which has a composition defined on a eutectoid point in the phase diagram, the primary $L1_2$ phase is not observed, but precipitation of a plate-like $D0_{24}$ phase is observed in contrast with the other samples.

1-5. Compression Test

Test samples for a compression test were prepared by annealing Samples No. 7, No. 10, No. 12 and No. 23 at 1273 K for 7 days or at 1373 K for 2 days, followed by water-quenching. The compression test was performed in a vacuum in a temperature range between room temperature and 1273 K at a strain rate of $3.3 \times 10^{-4}$ s$^{-1}$ with the use of a test piece with a size of 2×2×5 mm$^3$. The results of the test are shown in FIGS. 8A and 8B. FIG. 8A is a graph showing relationships between yield stress and temperature resulting from the compression test for the Samples No. 7, No. 10, No. 12 and No. 23 which were annealed at 1273 K for 7 days followed by water-quenching. FIG. 8B is a graph showing relationships between yield stress and temperature resulting from the compression test for the Samples No. 7, No. 10, No. 12 and No. 23 which were annealed at 1373 K for 2 days followed by water-quenching.

In comparison between FIGS. 8A and 8B, the samples annealed at 1373 K each had a strength increased by 100 to 400 MPa. This is supposedly because the samples were each entirely imparted with a dual multi-phase microstructure without precipitation of the $D0_{24}$ phase, and strengthened by solid solution hardening of Ti.

In FIG. 8B, Sample No. 7 is a reference example, and Samples No. 10, No. 12 and No. 23 are examples of the present invention. As seen from FIG. 8B, Sample No. 7 also shows a high yield strength. However, as shown in FIG. 7A, Sample No. 7 does not have the primary $L1_2$ phase, but has a primary $D0_{24}$ phase. Therefore, Sample No. 7 shows poor ductility compared with Samples No. 10, No. 12 and No. 23, and is supposedly difficult to handle. This is because the $L1_2$ phase has a simpler crystalline structure than the $D0_{24}$ phase, and dislocations are more likely to be activated in the $L1_2$ phase than the $D0_{24}$ phase.

1-6. High Temperature Creep Test

Figure 9A:
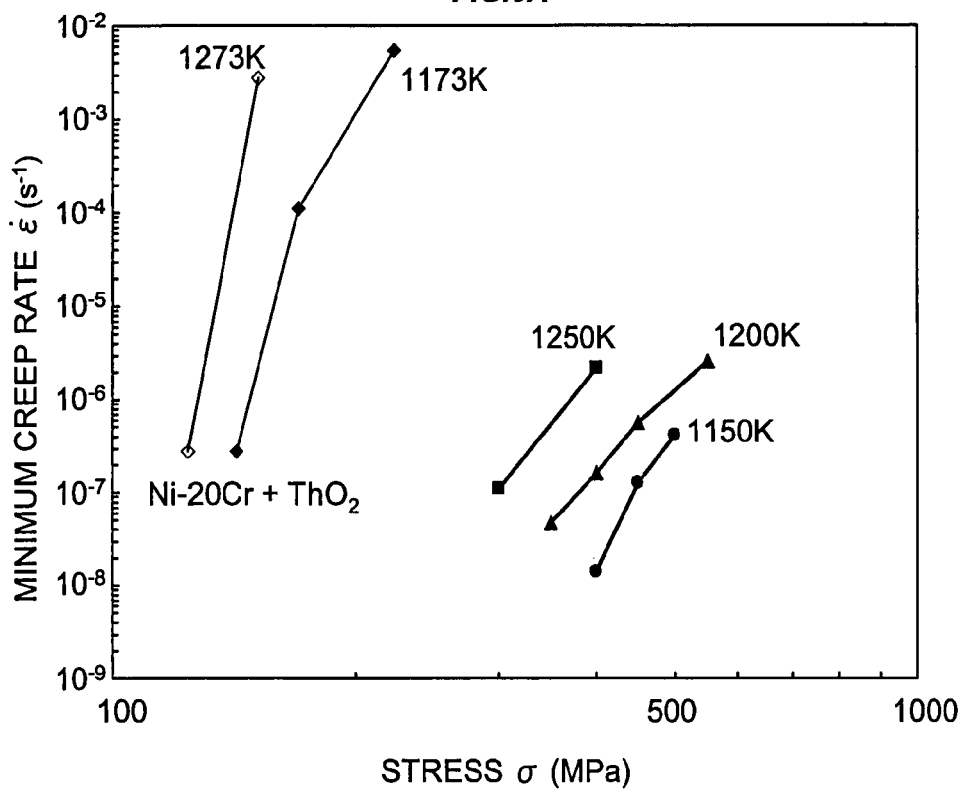
FIGS. 9A and 9B are graphs showing relationships between minimum creep rate and stress obtained from a high temperature compression creep test for the cast materials of No. 10 and No. 23, as the specific examples of the inventive intermetallic compound, which were annealed at 1373 K for 2 days followed by water-quenching.
Figure 9B:
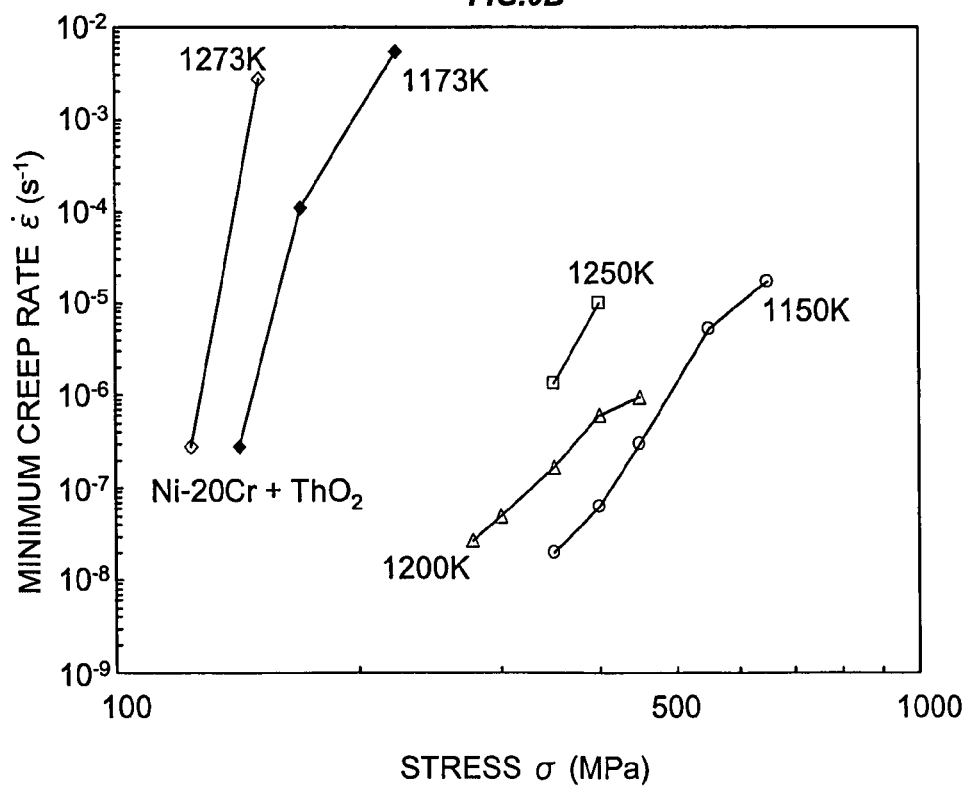

Test samples for a high temperature compression creep test were prepared by annealing Samples No. 10 and No. 23 at 1373 K for 2 days followed by water-quenching. The high temperature compression creep test was performed in a vacuum in a temperature range between 1150 K and 1250 K with a stress of 250 to 650 MPa using a test piece with a size of 2×2×5 mm$^3$. The results of the test performed on Samples No. 10 and No. 23 are shown in FIGS. 9A and 9B. Further, relationships between the normalized minimum creep rate and the normalized stress are shown in FIG. 10. FIGS. 9A and 9B are graphs showing relationships between minimum creep rate and stress resulting from the high temperature compression creep test performed on Samples No. 10 and No. 23, respectively. FIG. 10 is a graph showing relationships between normalized minimum creep rate and normalized stress resulting from a high temperature compression creep test performed on the cast materials of Samples No. 10 and No. 23.

The result of a high temperature compression creep test performed on Ni-20Cr+ThO$_2$ as a comparative example is also shown in FIGS. 9A, 9B and 10. Data for the comparative example is cited from R. W. Land and W. D. Nix, Acta Metall., 24 (1976)469. In FIGS. 9A, 9B and 10, the ε dot indicates the minimum creep rate, and σ indicates the stress. In FIG. 10, the normalized stress (σ/E) obtained by dividing the stress σ by the Young's modulus (E) is plotted as abscissa, and the normalized minimum creep rate obtained by dividing the minimum creep rate (εdot) by the diffusion constant (D) is plotted as ordinate for re-plotting the data of FIGS. 9A and 9B for compensation for an influence of variations in test temperature. It is noted that the Young's modulus of Ni$_3$Al and the diffusion constant of Ni in Ni$_3$Al are respectively used as the Young's modulus and the diffusion constant of Samples No. 10 and No. 23. As is apparent from FIGS. 9A, 9B and 10, Samples No. 10 and No. 23 each show a very low creep rate as compared with the comparative example.

1-7. Structural Change by Aging Heat Treatment and Mechanical Properties

In consideration of the use as a high temperature structural material to be subjected to high temperatures for a long period, it is necessary to understand a structural change at the high temperatures. Sample No. 23 annealed at 1373 K was further aged at 1173 K or 1273 K, and a microstructural change due to the aging heat treatment was examined. After the aging heat treatment, the sample was sealed in an evacuated quartz tube, then aged for a predetermined period, and water-quenched.

Figures 11A, 11B, 11C, 11D:
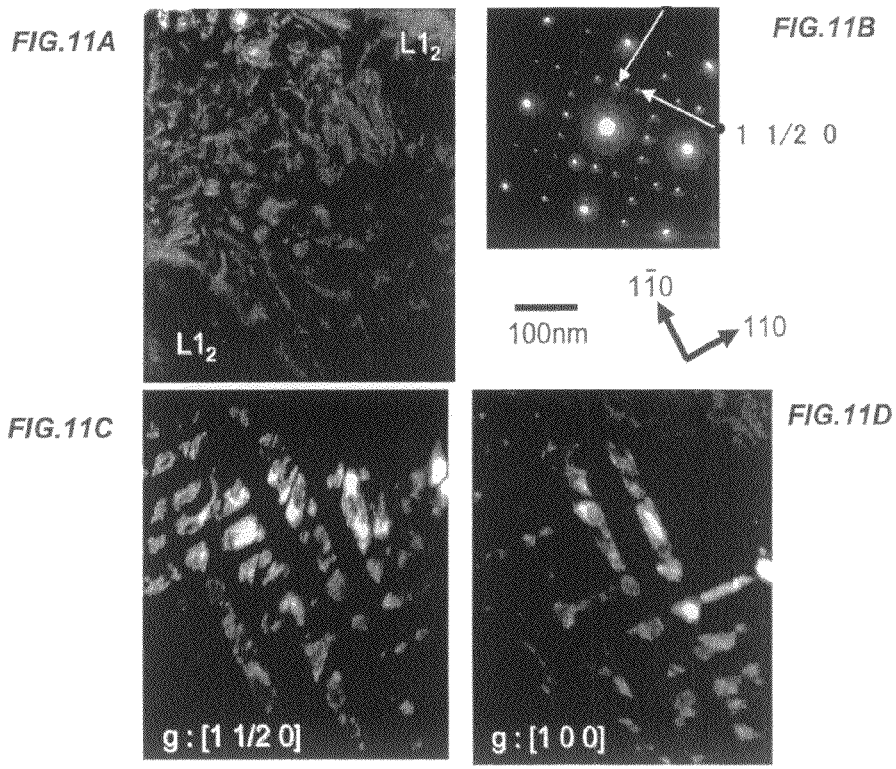
FIG. 11A shows a bright field image.
FIG. 11B shows a selected area diffraction pattern.
FIG. 11C shows a dark field image which was taken using a [1 1/2 0] spot of the selected area diffraction pattern and FIG. 11D is a dark field image which was taken using a [100] spot of the selected area diffraction pattern, respectively, for the eutectoid region of a sample No. 23 as a specific example of the inventive intermetallic compound, which was annealed at 1373 K for 2 days and then aged at 1173 K for 10 hours.

The heat treatment at 1373 K corresponds to the first heat treatment at the primary $L1_2$ phase/Al phase coexistence temperature, and the aging heat treatment at 1173 K or 1273 K performed after the heat treatment at 1373 K corresponds to the second heat treatment at the $L1_2$ phase/$D0_{22}$ phase coexistence temperature FIG. 11A is a bright field image, FIG. 11B is a selected area diffraction pattern, FIG. 11C is a dark field image which is taken using a [1 1/2 0] spot of the selected area diffraction pattern and FIG. 11D is a dark field image which is taken using a [100] spot of the selected area diffraction pattern, respectively, of a eutectoid region of Sample No. 23 annealed at 1373 K for 2 days and the subsequent aged at 1173 K for 10 hours. The sample has a zone axis <001>. The dark field images indicate that two variants of the $D0_{22}$ phase form an apparent lamellar structure, which is aligned along [110] or [11-0] direction (wherein "1-" means "1 with an over-bar" and this definition also applies in the following description). An interface between the variants is (110) or (11-0), and the variants are in a twin crystal relationship with their c-axes ([001] axes of $D0_{22}$ crystal lattices) extending perpendicularly to each other.

Figures 12A, 12B:
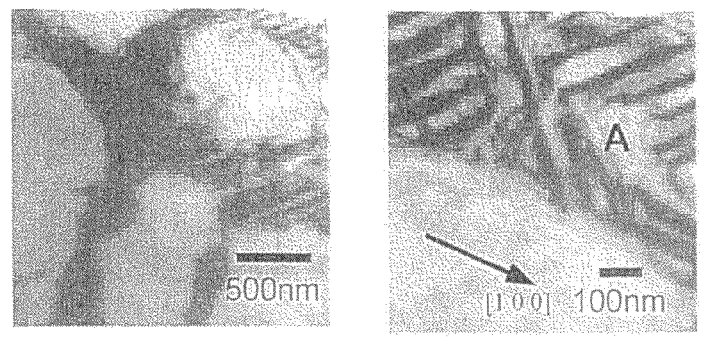
FIGS. 12A and 12B shows bright field images of the cast material of No. 23, as a specific example of the inventive intermetallic compound, which was annealed at 1373 K for 2 days and then aged at 1273 K for 2 days.

FIGS. 12A and 12B are bright field images of the eutectoid region of Sample No. 23 annealed at 1373 K for 2 days and subsequently aged at 1273 K for 2 days. FIG. 12B is an enlarged view around variant structures shown in FIG. 12A. The variant structures have grown with their orientation relationship kept as shown in FIGS. 11A to 11D. The lamella observed in the variant structures is absent in a region A in FIG. 12B. A field including this region was analyzed through TEM-EDX (Transmission Electron Microscope-Energy Dispersive X-ray Spectroscopy). As a result, it was found that the region A is composed of $Ni_3Al$. Thus, it was confirmed that the lamellar $D0_{22}$ variant structures and grain $L1_2$ phase coexist in the eutectoid region of the sample aged for a long period.

Figures 13A, 13B:
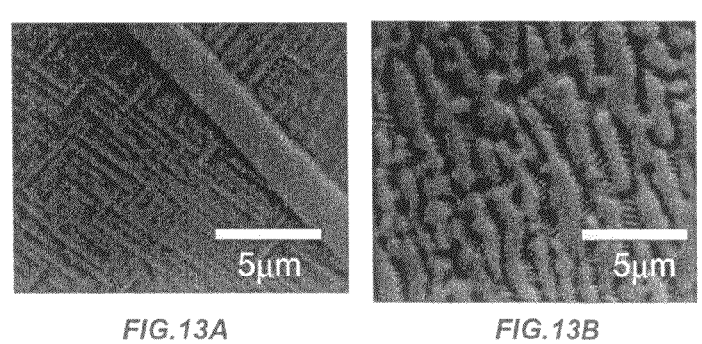
FIGS. 13A and 13B show SEM images of the cast materials of No. 7 and No. 23, as specific examples of the inventive intermetallic compound, which were annealed at 1373 K for 2 days and then aged at 1273 K for 12 days.

Next, SEM images of Samples No. 7 and No. 23 annealed at 1373 K for 2 days and subsequently aged at 1273 K for 12 days are shown in FIGS. 13A and 13B. FIG. 13A and FIG. 13B shows SEM images of Sample No. 7 and Sample No. 23, respectively.

Based on FIGS. 13A and 13B, it was confirmed that Samples No. 7 and No. 23 each show coarsened eutectoid microstructure. On the other hand, the primary $L1_2$ phases of Samples No. 7 and No. 23 are free from significant changes, and structurally stable.

Figure 14A:
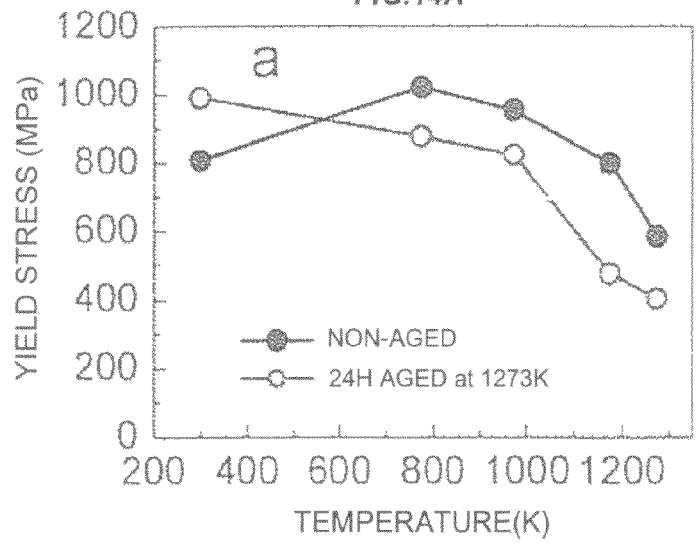
FIG. 14A is a graph showing relationships between yield stress and temperature obtained from a compression test for the cast material of No. 7 which was annealed at 1373 K for 2 days and for the cast material of No. 7 which was annealed at 1373 K for 2 days and then aged at 1273 K for 24 hours, as specific examples of the inventive intermetallic compound.

FIG. 14A is a graph showing relationships between yield stress and temperature resulting from a compression test performed on Sample No. 7 annealed at 1373 K for 2 days but not aged and on Sample No. 7 annealed at 1373 K for 2 days and subsequently aged at 1273 K for 24 hours. Further, FIG. 14B is a graph showing relationships between yield stress and temperature resulting from a compression test performed on Sample No. 23 annealed at 1373 K for 2 days but not aged and on Sample No. 23 annealed at 1373 K for 2 days and subsequently aged at 1273 K for 24 hours.

Figure 14B:
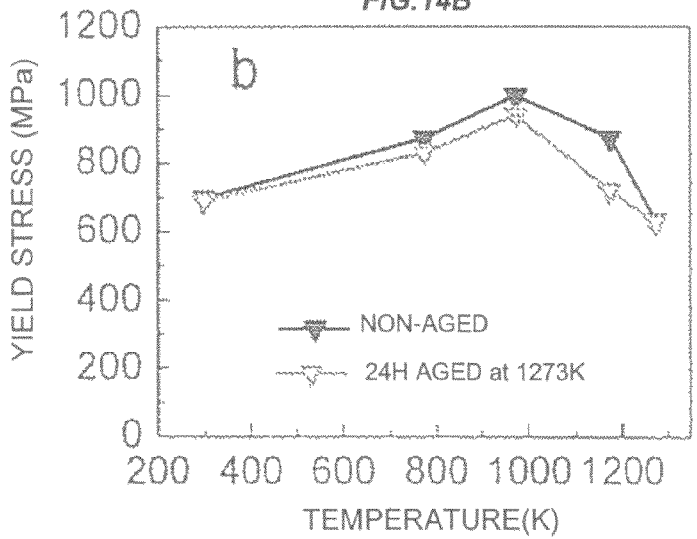
FIG. 14B is a graph showing relationships between yield stress and temperature obtained from a compression test for the cast material of No. 23 which was annealed at 1373 K for 2 days and for the cast material of No. 23 which was annealed at 1373 K for 2 days and then aged at 1273 K for 24 hours, as specific examples of the inventive intermetallic compound.

Comparison between FIGS. 14A and 14B indicates that a change in strength of Sample No. 23 at a high temperature is smaller than that of Sample No. 7. Thus, it was confirmed that the primary $L1_2$ phase under the coexistence with the eutectoid structure is stable even though the eutectoid structure coarsens, and consequently suppresses reduction in strength.

1-8. Discussion (1) Phase Fields in Phase Diagram

Figures 15A, 15B:
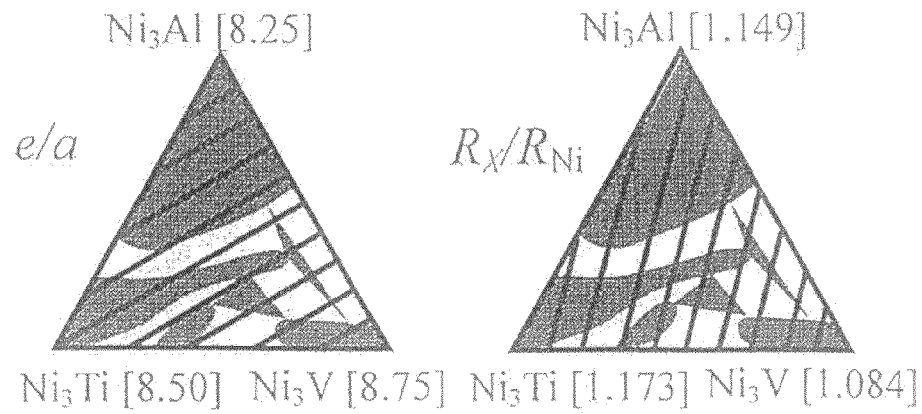
FIGS. 15A and 15B are contour maps of electron concentration (e/a) and atomic radius ratio ($R_x/R_{Ni}$) for the inventive intermetallic compound.

FIGS. 15A and 15B show the phase diagrams at 1273 K with which contour maps of the electron concentration (e/a) and the atomic radius ratio ($R_x/R_{Ni}$) are overlapped, respectively. As apparently seen in the $D0_{24}$ phase field, each phase field expands, strongly depending upon the electron concentration (e/a). This feature has also been observed in the $Ni_3Al$—$Ni_3Ti$—$Ni_3Nb$ system, and indicates that the phase field is primarily determined by the electron concentration.

In the case of the $Ni_3Al$—$Ni_3Ti$—$Ni_3Nb$ system, the contours of the electron concentration and the atomic radius ratio extend in the same direction. In the case of the $Ni_3Al$—$Ni_3Ti$—$Ni_3V$ system associated with the present invention, the contours of the electron concentration and the atomic radius ratio extend in different directions. Therefore, a reason why the $Ni_3Al$—$Ni_3Ti$—$Ni_3V$ system has a smaller $D0_{24}$ phase expansion range and a three-phase coexistence region shifted to the higher Ti content side is supposedly attributed to the fact that the atomic radius ratio affects the expansion of the phase. Thus, it is supposed that the atomic radius ratio secondarily determines the phase field.

(2) Preparation of Multi-Phase Intermetallic Compound with Fine Microstructure

The dual multi-phase microstructure having a high phase stability and high strength property against a high-temperature aging heat treatment was provided. The primary $L1_2$ phase in the dual multi-phase microstructure significantly influences the phase stability and the strength. The $D0_{22}$ twin variant structure, even if being coarse, maintains coherency with the primary $L1_2$ phase and, is therefore free from significant reduction in strength.

1-9. Conclusion (1) The $Ni_3Al$—$Ni_3Ti$—$Ni_3V$ pseudo-ternary system phase diagram at 1273 K was successfully obtained. The concentration regions where the respective phases exist expand, strongly depending upon the electron concentration (e/a).

(2) Three types of two-phase equilibriums ($L1_2$-$D0_{24}$, $D0_{22}$-$D0_{24}$ and $L1_2$-$D0_{22}$ equilibriums) and a three-phase equilibrium ($L1_2$-$D0_{24}$-$D0_{22}$ equilibrium) were observed among the three constituent phases.

(3) The intermetallic compounds with the dual multi-phase microstructure comprising the primary $L1_2$ phase and the fine ($L1_2$+$D0_{22}$) eutectoid microstructure with high coherency each other were successfully obtained through the heat treatment at 1373 K and the subsequent water quenching.

(4) It was confirmed that the dual multi-phase microstructure includes the primary $L1_2$ phase, the $D0_{22}$ twin crystal variant structure and the granular $L1_2$ phase. In spite of the aging heat treatment at a high temperature for a long period, the growth of the primary $L1_2$ phase was not observed. This indicates that the dual multi-phase microstructure has high microstructural stabilities.

(5) The samples with the dual multi-phase microstructure show a positive temperature dependence of strength, and show a high strength at high temperatures. The samples with the dual multi-phase microstructure are less susceptible to reduction in strength due to the high-temperature aging heat treatment, and have stable mechanical properties.

2. Forged Materials

Intermetallic compounds with a dual multi-phase microstructure were prepared by heat treatment of the forged materials, and mechanical properties of the intermetallic compounds were examined.

2-1. Method of Preparing Forged Materials

Cast master alloys were first prepared by melting raw metals of Ni, Al, Ti and V (each having a purity of 99.9 wt %) in proportions shown in the rows of No. 10 and No. 12 in Table 1 in an arc melting furnace. Then, the master alloys were each melted in a water-cooled copper crucible through high frequency induction melting, and the resulting melt was cast into a cylindrical mold (of ceramic). Thus, cast materials with a diameter of 68 mm and a height of 70 mm were prepared. Next, the obtained cast materials were heated to be kept at 1573 K, and forged to be compressed to a thickness of 20 mm. The resulting materials were kept at a temperature of 1473 K to 1523 K for 15 minutes to 25 minutes for recrystallization annealing. Thus, the forged materials were prepared. Further, another forged material was prepared by adding 500 ppm of B to No. 10, and this forged material is hereinafter referred to as Sample No. 10B. In the following description, the forged materials will be referred to simply as samples.

2-2. Heat Treatment

The samples prepared by the aforementioned method were annealed at 1373 K for 10 hours, and then annealed at 1273 K for 10 hours. Thus, intermetallic compound samples with a dual multi-phase microstructure comprising a primary $L1_2$ phase and an ($L1_2$+$D0_{22}$) eutectoid microstructure were provided as described above.

After the heat treatment at 1273 K, the samples were allowed to be put in a heat treatment furnace to be cooled to room temperature with a heater of the heat treatment furnace turned off, and then taken out of the heat treatment furnace.

The heat treatment at 1373 K corresponds to the first heat treatment at the primary $L1_2$ phase/Al phase coexistence temperature, and the heat treatment at 1273 K performed after the heat treatment at 1373 K corresponds to the second heat treatment at the $L1_2$ phase/$D0_{22}$ phase coexistence temperature.

2-3. Tensile Test

Figure 16:
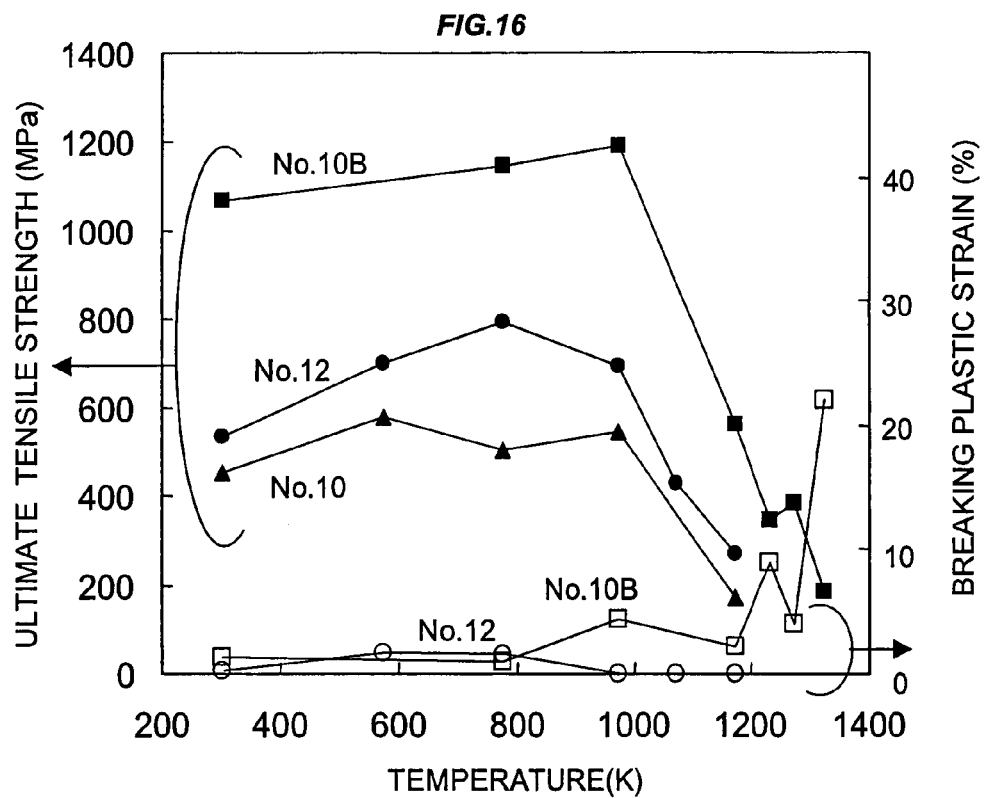
FIG. 16 is a graph showing relationships between ultimate tensile strength or breaking plastic strain and temperature for the forged materials of No. 10, No. 10B and No. 12, as specific examples of the inventive intermetallic compound, which were annealed at 1373 K for 10 hours and then at 1273 K for 10 hours.
Figure 17:
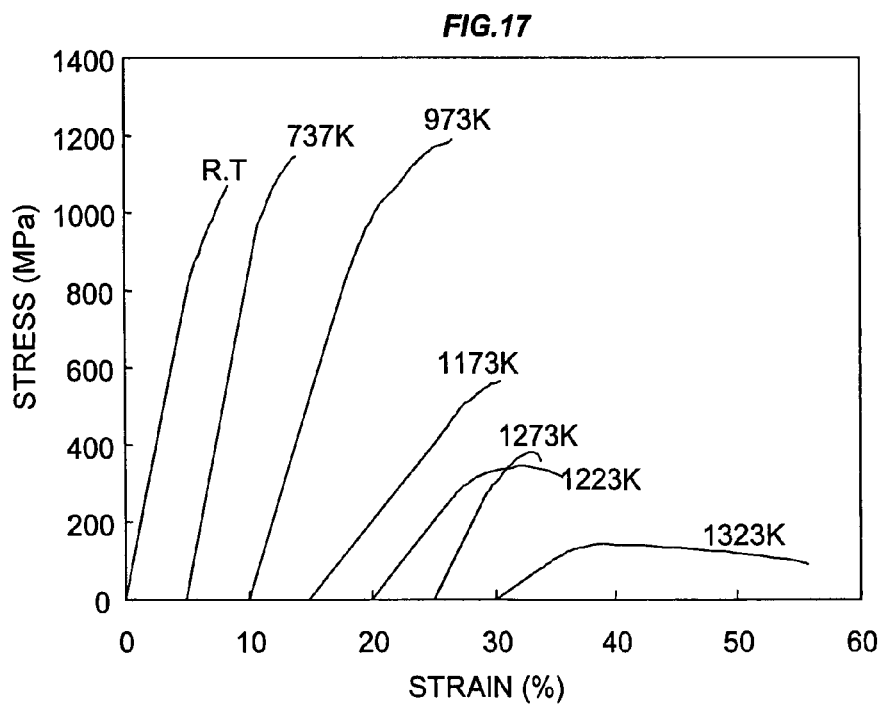
FIG. 17 is a graph showing stress-strain curves at various temperatures for the forged material of No. 10B, as the specific example of the inventive intermetallic compound, which was annealed at 1373 K for 10 hours and then at 1273 K for 10 hours.
Figure 18:
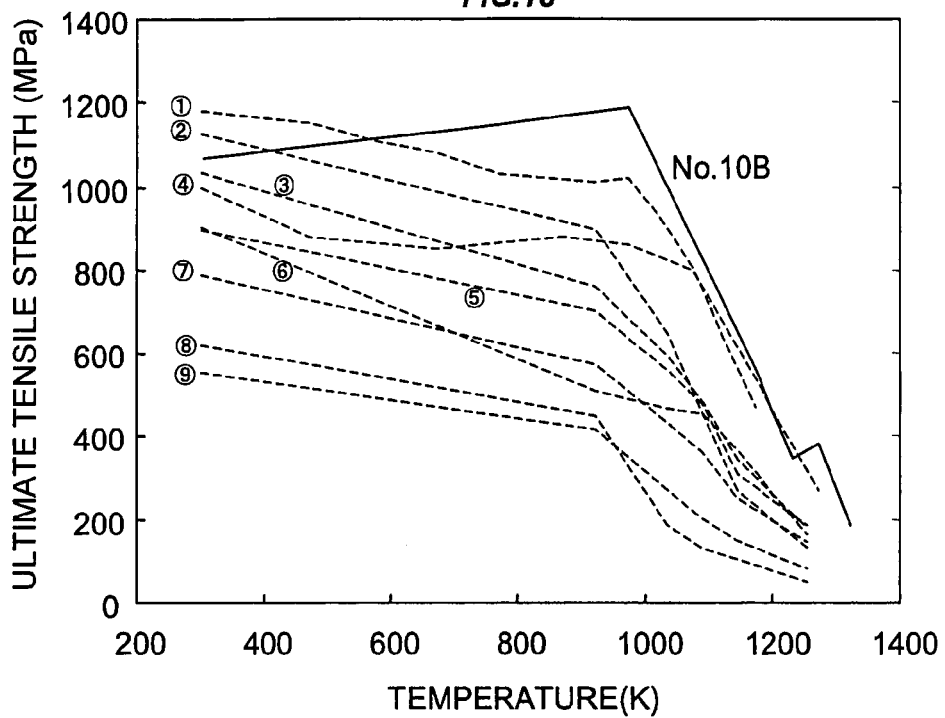
FIG. 18 is a graph showing relationships between ultimate tensile strength and temperature for comparison between some conventional superalloys and the present forged material of No. 10B, as the specific example of the inventive intermetallic compound, which was annealed at 1373 K for 10 hours and then at 1273 K for 10 hours.

Annealed Samples No. 10, No. 10B and No. 12 were tensile-tested. The tensile test was performed in a vacuum in a temperature range between room temperature and 1323 K at a strain rate of $1.66 \times 10^{-4}$ s$^{-1}$ using a test piece with a gage size of $10 \times 2 \times 1$ mm$^3$. The results of the test are shown in FIG. 16. Stress-strain curves at different temperatures for Sample No. 10B are shown in FIG. 17. Further, the tensile strength of Sample No. 10B was compared with the tensile strengths of some conventional superalloys. The results of the comparison are shown in FIG. 18. In FIG. 18, numerals 1 to 9 denote the following conventional superalloys: (1) Inconel® 700; (2) Inconel X750; (3) S816; (4) U500; (5) Hastelloy® C; (6) Hastelloy B; (7) Haslelloy X; (8) Inconel 600; and (9) Incoloy® 800. Data for these superalloys are cited from the Taihei Techno Service's homepage (http://www.taihei-s.com/seihin13.htm). Similar data also appears in Metals Handbook Ninth Edition No. 3, ASM, pp. 187-333 (1980). Referring to FIGS. 16 to 18, the inventive intermetallic compounds prepared from the forged materials are excellent in mechanical strength, and comparable to the various conventional superalloys.

3. Single Crystal Material

An intermetallic compound with a dual multi-phase microstructure was prepared by heat-treating a single crystal material, and the mechanical properties of the intermetallic compound were examined.

3-1. Method of Preparing Single Crystal Material

A single crystal material was prepared by Bridgeman method (pulling-up method). More specifically, the single crystal material was prepared in the following manner. First, a cast master alloy was prepared by melting raw metals of Ni, Al, Ti and V (each having a purity of 99.9 wt %) in proportions shown in the row of the alloy No. 10 in Table 1 in an arc melting furnace. Next, the master alloy was put in an alumina crucible, and melted in an inert gas (argon gas) in a high frequency induction furnace. Then, the crucible was slowly pulled up at a rate of about 5 mm/h in the high frequency induction furnace, and the resulting material was solidified from an end portion thereof. Thus, the single crystal material was prepared. In the following description, the single crystal material will be referred to as sample.

3-2. Heat Treatment

The sample prepared by the aforesaid method was annealed at 1373 K for 10 hours, and then at 1273 K for 10 hours. Thus, an intermetallic compound with a dual multi-phase microstructure composed of a primary $L1_2$ phase and an ($L1_2$+$D0_{22}$) eutectoid structure was provided.

After the heat treatment at 1273 K, the sample was allowed to be put in a heat treatment furnace to be cooled to room temperature with a heater of the heat treatment furnace turned off, and then taken out of the heat treatment furnace.

The heat treatment at 1373 K corresponds to the first heat treatment at the primary $L1_2$ phase/Al phase coexistence temperature, and the heat treatment at 1273 K performed after the heat treatment at 1373 K corresponds to the second heat treatment at the $L1_2$ phase/$D0_{22}$ phase coexistence temperature.

3-3. Tensile Test

Figure 19:
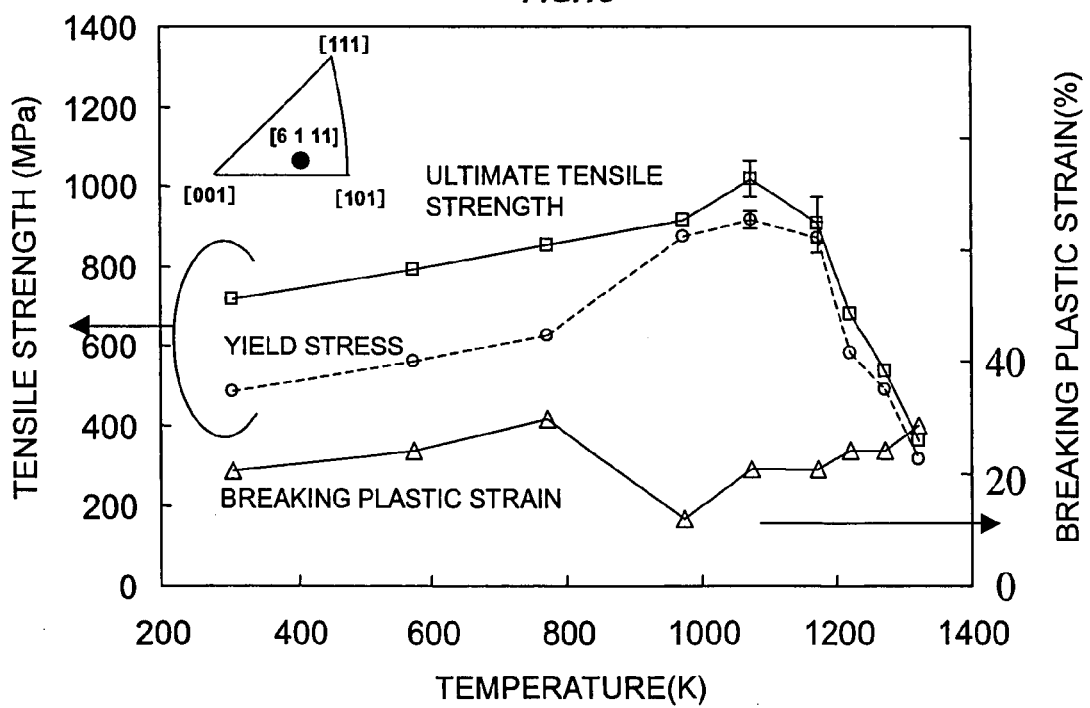
FIG. 19 is a graph showing relationships between ultimate tensile strength or breaking plastic strain and temperature for the single crystal material of No. 10, as a specific example of the inventive intermetallic compound, which was annealed at 1373 K for 10 hours and then at 1273 K for 10 hours.
Figure 20:
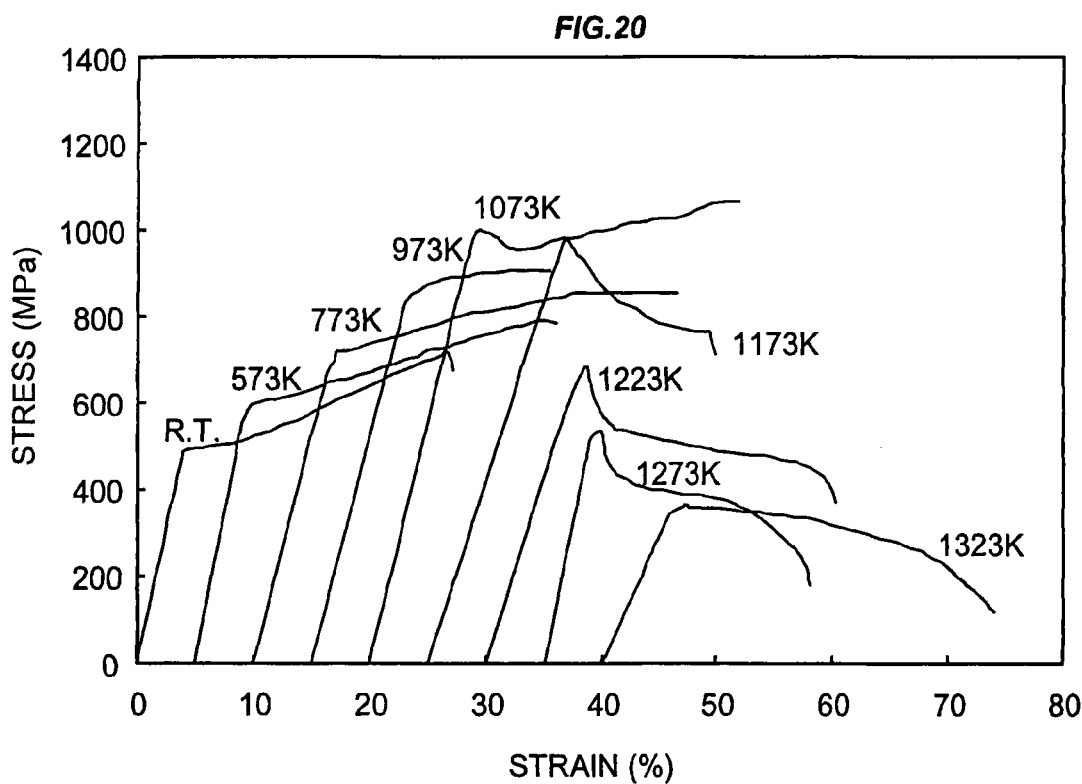
FIG. 20 is a graph showing stress-strain curves at various temperatures for the single crystal material of No. 10, as the specific example of the inventive intermetallic compound, which was annealed at 1373 K for 10 hours and then at 1273 K for 10 hours.
Figure 21:
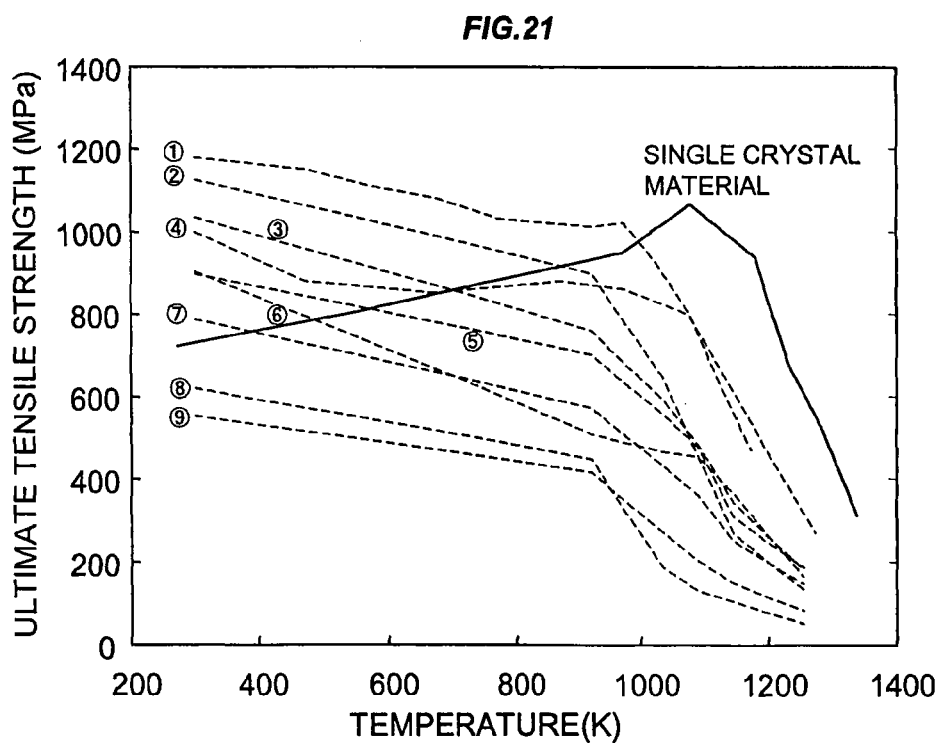
FIG. 21 is a graph showing relationships between ultimate tensile strength and temperature for comparison between some conventional superalloys and the single crystal of No. 10, as the specific example of the inventive intermetallic compound, which was annealed at 1373 K for 10 hours and then at 1273 K for 10 hours.

The annealed sample was tensile-tested. The tensile test was performed in a vacuum in a temperature range between room temperature and 1323 K at a strain rate of $1.67 \times 10^{-4}$ s$^{-1}$ using a test piece with a gage size of $10 \times 2 \times 1$ mm$^3$. The results of the test are shown in FIG. 19. Stress-strain curves at different temperatures are shown in FIG. 20. Further, the tensile strength of the sample was compared with the tensile strengths of some conventional superalloys. The results of the comparison are shown in FIG. 21. In FIG. 21, numerals 1 to 9 denote the following existing superalloys: (1) Inconel 700; (2) Inconel X750; (3) S816; (4) U500; (5) Hastelloy C; (6) Hastelloy B; (7) Haslelloy X; (8) Inconel 600; and (9) Incoloy 800 (the same data as in FIG. 18). Referring to FIG. 21, the inventive intermetallic compound prepared from the single crystal material is excellent in tensile strength, and comparable to the various conventional superalloys.

3-4. High Temperature Tensile Creep Test

Figure 24:
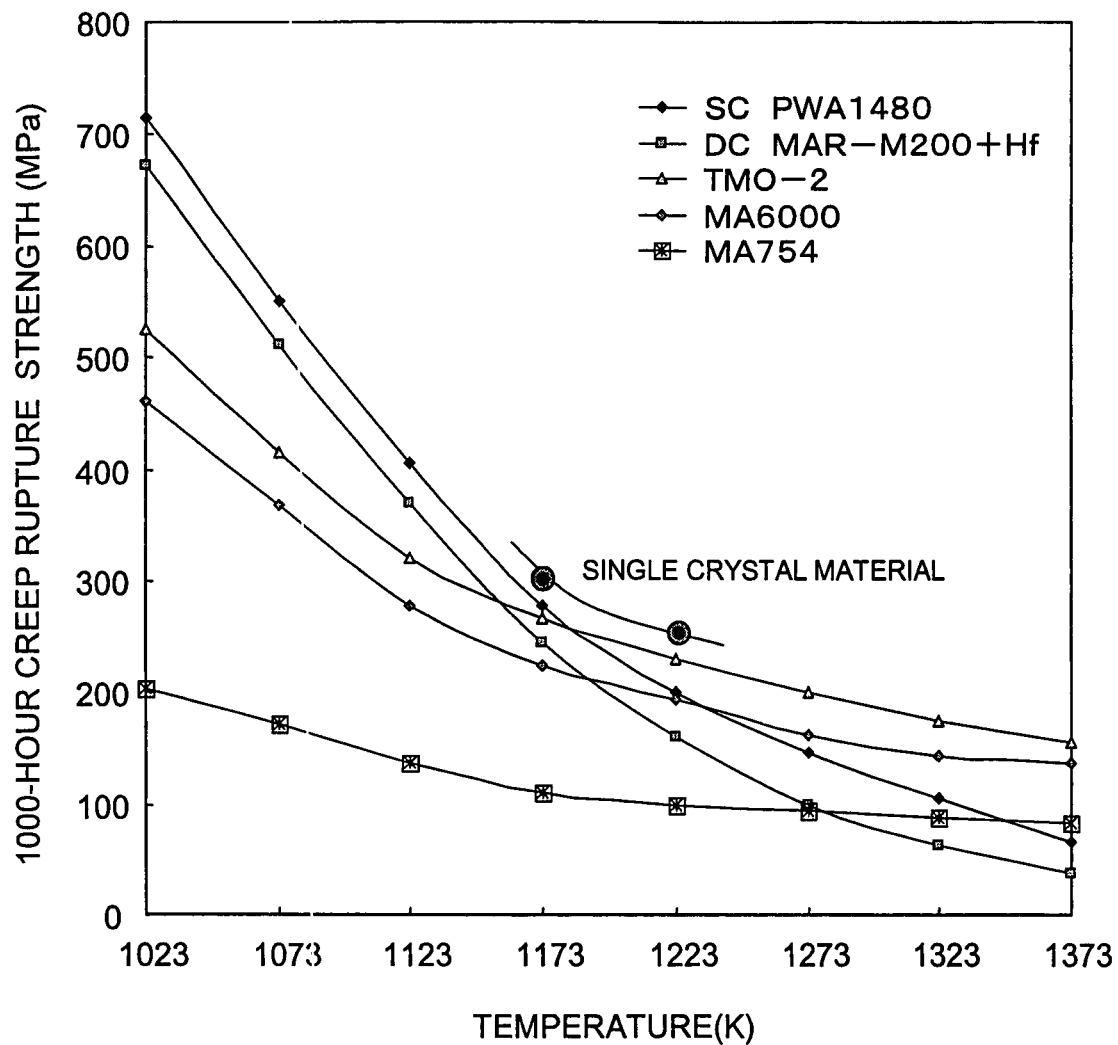
FIG. 24 is a graph showing a relationship between 1000-hour creep rupture strength and temperature for the single crystal material of No. 10, as the specific example of the inventive intermetallic compound, which was annealed at 1373 K for 10 hours and then at 1273 K for 10 hours.

The annealed sample was subjected to a high temperature tensile creep test. The high temperature tensile creep test was performed in a vacuum in a temperature range between 1173 K and 1223 K with a stress of 300 to 500 MPa using a test piece with a size of $10 \times 2 \times 1$ mm$^3$. A relationship between normalized minimum creep rate and normalized stress is shown in FIG. 22. The result of a high-temperature tensile creep test performed on Ni-20Cr+$ThO_2$ as a comparative example is also shown in FIG. 22 (in which ε dot is a minimum creep rate, D is a diffusion constant of Ni in $Ni_3Al$, σ is the stress, and E is the young's modulus of $Ni_3Al$). Further, relationships between stress and creep rupture life for the sample and comparative examples are shown in. FIGS. 23A and 23B. FIGS. 23A and 23B show the results of the test performed at 1173 K and 1223 K, respectively. Relationships between 1000-hour creep rupture strength obtained by extrapolation of data points in FIGS. 23A and 23B and temperature for the sample and the comparative examples are shown in FIG. 24. TMS-82+ and TMS-75 employed as the comparative examples are called a second-generation Ni superalloy and a third-generation Ni superalloy, respectively. The data of the comparative examples are cited from the NIMS materials database's homepage (http://mits.nims-.go.jp). Similar data also appears in: [1] Maldini M, Harada H, Koizumi Y, Kobayashi T, Lupinc V. Scripta Materialia 43 (2000)637; and [2] Koizumi Y, Harada H, Kobayashi T, Yokokawa T. Journal of the Japan Institute of Metals 69 (2005)743. As apparent from FIGS. 22 to 24, the inventive intermetallic compound prepared from the single crystal material is excellent in mechanical strength, and comparable to the various conventional superalloys.

The invention claimed is:

1. A $Ni_3Al$-based intermetallic compound comprising:
greater than 5 at % and not greater than 13 at % of Al;
not less than 9.5 at % and less than 17.5 at % of V;
not less than 0 a % and not greater than 3.5 at % of Ti;
not less than 50 weight ppm and not greater than 1000 weight ppm of B; and
the remaining portion consisting of Ni and inevitable impurities, wherein
the $Ni_3Al$-based intermetallic compound has a dual multi-phase structure comprising a primary $L1_2$ phase and an ($L1_2$ +$D0_{22}$) eutectoid microstructure, and
the ultimate tensile strength of the $Ni_3Al$-based intermetallic compound is 1100 to 1200 Mpa at 600 to 1000K.

2. The intermetallic compound of claim 1, wherein the content of Ti is 0.5 to 3.5 at %.

3. The intermetallic compound of claim 1, wherein the content of Al is 6 to 9 at %, the content of V is 13.5 to 16.5 at %, the content of Ti is 1 to 3.5 at %, and the content of B is 200 to 800 weight ppm.

4. The intermetallic compound of claim 1, wherein the content of Al is 7 to 8 at %, the content of V is 14.5 to 15.5 at %, the content of Ti is 2 to 3 at %, and the content of B is 400 to 600 weight ppm.

5. A heat resistant structural material comprising the $Ni_3Al$-based intermetallic compound of any one of claims 1, 2, 3 and 4.

6. Forged materials containing a $Ni_3Ai$-based intermetallic compound comprising:
 greater than 5 at % and not greater than 13 at % of Al;
 not less than 9.5 at % and greater than 17.5 at % of V;
 not less than 0 at % and not greater than 3.5 at % of Ti;
 not less than 50 weight ppm and not greater than 1000 weight ppm of B; and
 the remaining portion consisting of Ni and inevitable impurities, wherein
 the $Ni_3Al$-based intermetallic compound has a dual multi-phase structure comprising a primary $L1_2$ phase and an ($L1_2 + D0_{22}$) eutectoid microstructure, and
 the ultimate tensile strength of the $Ni_3Al$-based intermetallic compound is 1100 to 1200 Mpa at 600 to 1000K.

7. A single crystal material containing a $Ni_3Al$-based intermetallic compound consisting of:
 less than 5 at % and not greater than 13 at % of Al;
 not less than 9.5 at % and less than 17.5 at % of V;
 not less than 0 at % and not greater than 3.5 at % of Ti;
 not less than 50 weight ppm and not greater than 1000 weight ppm of B; and
 the remaining portion consisting of Ni and inevitable impurities, wherein
 the $Ni_3Al$-based intermetallic compound has a dual multi-phase structure of a primary $L1_2$ phase and an ($L1_2 + D0_{22}$) eutectoid microstructure, and
 the ultimate tensile strength of the $Ni_3Al$-based intermetallic compound is 800 to 1100 Mpa at 1000 to 1200K.

8. A $Ni_3Al$-based intermetallic compound consisting of:
 greater than 5 at % and not greater than 13 at % of Al;
 not less than 9.5 at % and less than 17.5 at % of V;
 not less than 0 at % and not greater than 3.5 at % of Ti;
 not less than 50 weight ppm and not greater than 1000 weight ppm of B; and
 the remaining portion consisting of Ni and inevitable impurities, wherein
 the $Ni_3Al$-based intermetallic compound has a dual multi-phase structure of a primary $L1_2$ phase and an ($L1_2 + D0_{22}$) eutectoid microstructure, and
 the ultimate tensile strength of the $Ni_3Al$-based intermetallic compound is 1100 to 1200 Mpa at 600 to 1000K.

9. The forged materials of claim 6, wherein the content of B in the intermetallic compound is 400 to 600 weight ppm.

10. The single crystal material of claim 7, wherein the content of B in the intermetallic compound is 400 to 600 weight ppm.

11. The $Ni_3Al$-based intermetallic compound of claim 8, wherein the content of B in the intermetallic compound is 400 to 600 weight ppm.

* * * * *